(12) United States Patent
Tamari et al.

(10) Patent No.: US 11,908,785 B2
(45) Date of Patent: Feb. 20, 2024

(54) SEMICONDUCTOR DEVICE AND METHODS OF MANUFACTURING SEMICONDUCTOR DEVICE

(71) Applicant: Panasonic Intellectual Property Management Co., Ltd., Osaka (JP)

(72) Inventors: Takeru Tamari, Osaka (JP); Daisuke Sakurai, Osaka (JP); Kiyokazu Itoi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 56 days.

(21) Appl. No.: 17/238,286

(22) Filed: Apr. 23, 2021

(65) Prior Publication Data
US 2021/0366817 A1 Nov. 25, 2021

(30) Foreign Application Priority Data
May 19, 2020 (JP) .................................. 2020-087512

(51) Int. Cl.
*H01L 23/498* (2006.01)
*G01B 7/16* (2006.01)
(Continued)

(52) U.S. Cl.
CPC .......... *H01L 23/49833* (2013.01); *G01B 7/20* (2013.01); *H01L 21/486* (2013.01);
(Continued)

(58) Field of Classification Search
CPC ........... H01L 23/49833; H01L 21/4857; H01L 21/486; H01L 23/481; H01L 23/49816;
(Continued)

(56) References Cited

U.S. PATENT DOCUMENTS

| | | | | |
|---|---|---|---|---|
| 2005/0252311 A1* | 11/2005 | Ong | ..................... | H05K 1/0271 73/862.637 |
| 2012/0031192 A1* | 2/2012 | Duenas | .................. | H01L 29/84 73/777 |

(Continued)

FOREIGN PATENT DOCUMENTS

| | | |
|---|---|---|
| JP | 2014-49500 | 3/2014 |
| JP | 2014-523645 | 9/2014 |

(Continued)

*Primary Examiner* — Benjamin Tzu-Hung Liu
(74) *Attorney, Agent, or Firm* — Wenderoth, Lind & Ponack, L.L.P.

(57) ABSTRACT

A semiconductor device includes: a first board that has a first end surface and a second end surface opposite to the first end surface; a second board that is attached to the second end surface of the first board; a plurality of first electrodes that are provided on the first end surface; a second electrode that is provided on the second end surface and electrically coupled to an electrode of the second board; an internal wiring that is provided inside the first board and electrically coupled to the second electrode; a plurality of third electrodes that are provided inside the first board and electrically couple the first electrodes to the internal wiring; and a strain sensor that is provided inside the first board and measures a strain generated in the first board, in which a linear expansion coefficient of each of the third electrodes is larger than a linear expansion coefficient of the first board.

17 Claims, 13 Drawing Sheets

(51) Int. Cl.
*H01L 21/48* (2006.01)
*H01L 23/48* (2006.01)

(52) U.S. Cl.
CPC ........ *H01L 21/4857* (2013.01); *H01L 23/481* (2013.01); *H01L 23/49816* (2013.01); *H01L 23/49822* (2013.01); *H01L 23/49838* (2013.01)

(58) Field of Classification Search
CPC ........ H01L 23/49822; H01L 23/49838; G01B 7/20
See application file for complete search history.

(56) References Cited

U.S. PATENT DOCUMENTS

| | | |
|---|---|---|
| 2014/0061940 A1 | 3/2014 | Kitao et al. |
| 2015/0262708 A1 | 9/2015 | Lee |
| 2017/0358527 A1* | 12/2017 | Lu .................. H01L 21/486 |
| 2018/0141805 A1* | 5/2018 | Teo ................. H01L 23/3114 |
| 2018/0356302 A1* | 12/2018 | Ashida ............ G01L 9/0055 |
| 2020/0235155 A1* | 7/2020 | Sugiyama ....... H01L 27/1469 |

FOREIGN PATENT DOCUMENTS

| | | |
|---|---|---|
| JP | 2014-225610 | 12/2014 |
| JP | 2019-067937 | 4/2019 |
| WO | 2013/002844 | 1/2013 |
| WO | 2017/056673 | 4/2017 |
| WO | 2019/069669 | 4/2019 |

* cited by examiner

8(Crystal orientation [100])

8(Crystal orientation [110])

| Inspection item | Detect item | | | |
|---|---|---|---|---|
| | Appearance | Continuity | X-ray (position shifting) | Continuity (late-coming) |
| Conventional inspection | Yes | Yes | Yes | No |
| Present disclosure inspection | Yes | Yes | Yes | Yes |

SEMICONDUCTOR DEVICE AND METHODS OF MANUFACTURING SEMICONDUCTOR DEVICE

BACKGROUND

1. Technical Field

The present disclosure relates to a semiconductor device and a method for manufacturing the semiconductor device.

2. Description of the Related Art

In recent years, semiconductor devices such as laminated image sensors, in which a plurality of boards are laminated and bonded together, are effectively utilized in achieving high density, miniaturization, or thinning A through electrode is attracting attention as one technique for laminating a plurality of boards. A laminated board of a solid-state imaging device (semiconductor device) disclosed in International Publication No. 2019/069669 has a structure in which a logic board, which is a lower side board, and a pixel sensor board, which is an upper side board, are bonded in the up-down direction. The lower side board includes a semiconductor board which is a silicon board made of silicon (Si) and a multilayer wiring layer formed on the upper side of the semiconductor board. A control circuit, a logic circuit, and the like are configured with the multilayer wiring layer. A plurality of through holes are formed at predetermined positions on the semiconductor board, and a through electrode is formed by embedding a coupling conductor in each of the through holes. Electrodes are formed on the bonded surfaces of the lower side board and the upper side board, respectively. As a result, these electrodes are coupled to each other. The through electrodes are electrically coupled to these electrodes.

SUMMARY

According to an aspect of the present disclosure, there is provided a semiconductor device including: a first board that has a first end surface and a second end surface opposite to the first end surface; a second board that is attached to the second end surface of the first board; a plurality of first electrodes that are provided on the first end surface; a second electrode that is provided on the second end surface and electrically coupled to an electrode of the second board; an internal wiring that is provided inside the first board and electrically coupled to the second electrode; a plurality of third electrodes that are provided inside the first board and electrically couple the first electrodes to the internal wiring; and a strain sensor that is provided inside the first board and measures a strain generated in the first board, in which a linear expansion coefficient of each of the third electrodes is larger than a linear expansion coefficient of the first board.

According to another aspect of the present disclosure, there is provided a method for manufacturing a semiconductor device, the method including: forming a first insulating layer on a base material; forming a strain sensor on the first insulating layer; forming a second insulating layer so as to cover the strain sensor; forming an internal wiring in the second insulating layer; forming a multilayered internal wiring layer so as to cover the internal wiring; forming a hole on a side of the base material opposite to the multilayered internal wiring layer; forming an electrode in the hole so as to be adjacent to the strain sensor; coupling an external coupling electrode, which transmits a voltage detected by the strain sensor to an external apparatus, to the electrode; and bonding a board so as to cover the internal wiring.

DETAILED DESCRIPTIONS

Figure 1:
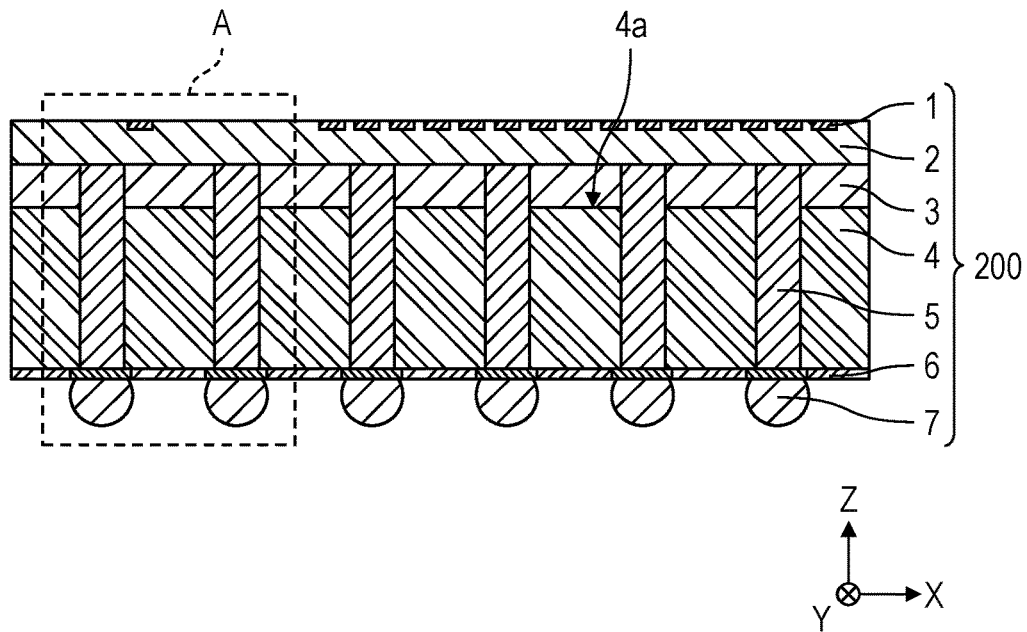
FIG. 1 is an overall cross-sectional view of semiconductor device 200 according to a first exemplary embodiment of the present disclosure.

However, in this type of laminated board, the linear expansion coefficients of the semiconductor board and the through electrode provided inside the semiconductor board are different. Therefore, in a process of cooling until it reaches room temperature after heating (generally 350 to 500° C.) during bonding of the upper side board to the lower side board, strain remains in the semiconductor board. Therefore, normal stress such as compression or expansion is generated between the semiconductor board and the bonded surface. As a result, the electrical coupling between the bonded surfaces of the upper side board and the lower side board may be lost, and continuity failure may occur. Therefore, in the related art, there is room for improvement in suppressing the occurrence of a failure due to the difference in linear expansion coefficient between the semiconductor board and the through electrode.

Non-limiting aspects of the present disclosure contribute to the provision of a semiconductor device and a manufacturing method for suppressing the occurrence of a failure due to a difference in linear expansion coefficient between a semiconductor board and a through electrode.

According to an aspect of the present disclosure, there is provided a semiconductor device including: a first board that has a first end surface and a second end surface opposite to the first end surface; a plurality of first electrodes that are provided on the first end surface; a second electrode that is provided on the second end surface and electrically coupled to an electrode of a second board that is attached to the second end surface; an internal wiring that is provided inside the first board and electrically coupled to the second electrode; a plurality of third electrodes that are provided inside the first board and electrically couple the first electrode and the internal wiring to each other; and a strain sensor that is provided inside the first board and measures a strain generated in the first board, in which a linear expansion coefficient of the third electrode is larger than a linear expansion coefficient of the first board.

According to another aspect of the present disclosure, there is provided a method for manufacturing a semiconductor device, the method including: forming a first insulating layer on a base material; forming a strain sensor on the first insulating layer; forming a second insulating layer so as to cover the strain sensor; forming an internal wiring in the second insulating layer; forming a multilayered internal wiring layer so as to cover the internal wiring; forming a hole on a side of the base material opposite to the multilayered internal wiring layer; forming an electrode in the hole so as to be adjacent to the strain sensor; coupling an external coupling electrode, which transmits a voltage detected by the strain sensor to an external apparatus, to the electrode; and bonding a board so as to cover the internal wiring.

According to one aspect of the present disclosure, it is possible to construct a semiconductor device and a manufacturing method that suppress the occurrence of a failure due to a difference in linear expansion coefficient between the semiconductor board and the through electrode.

Further advantages and effects in one aspect of the present disclosure will be apparent from the specification and drawings. Such advantages and/or effects are provided by some exemplary embodiments and features described in the specification and drawings, respectively, but not all need to be provided to obtain one or more identical features.

Preferred exemplary embodiments of the present disclosure will be described in detail below with reference to the accompanying drawings. In the present specification and the drawings, components having substantially the same function are designated by the same reference numerals so that duplicate description will be omitted. In the following drawings, the shapes, thicknesses, lengths, or the like of the constituent members illustrated in each are different from the actual shapes, thicknesses, lengths, or the like of the constituent members in the drawing. Further, the material of each constituent member is not limited to the material described in the present exemplary embodiment. In the exemplary embodiment of the present disclosure, the number of through electrodes, rewirings, external coupling electrodes, bonded electrodes, micro vias, internal wirings, insulating layers, or the like provided in the semiconductor device may differ from the actual number.

In FIG. 1 and later, the X-axis direction, the Y-axis direction, and the Z-axis direction represent a direction parallel to the X-axis, a direction parallel to the Y-axis, and a direction parallel to the Z-axis, respectively. The X-axis direction and the Y-axis direction are orthogonal to each other. The X-axis direction and the Z-axis direction are orthogonal to each other. The Y-axis direction and the Z-axis direction are orthogonal to each other. The XY plane represents a virtual plane parallel to the X-axis direction and the Y-axis direction. The XZ plane represents a virtual plane parallel to the X-axis direction and the Z-axis direction. The YZ plane represents a virtual plane parallel to the Y-axis direction and the Z-axis direction. Of the X-axis directions, it is assumed that a direction indicated by the arrow is the plus X-axis direction, and a direction opposite to the plus X-axis direction is the minus X-axis direction. Of the Y-axis directions, it is assumed that a direction indicated by the arrow is the plus Y-axis direction, and a direction opposite to the plus Y-axis direction is the minus Y-axis direction. Of the Z-axis directions, it is assumed that a direction indicated by the arrow is the plus Z-axis direction, and a direction opposite to the plus Z-axis direction is the minus Z-axis direction. The Z-axis direction is, for example, equal to the vertical direction, the laminating direction, or the up-down direction, and the X-axis direction and the Y-axis direction are equal to, for example, the horizontal direction or the left-right direction.

First Exemplary Embodiment

Configuration Example of Semiconductor Device 200

Figure 2:
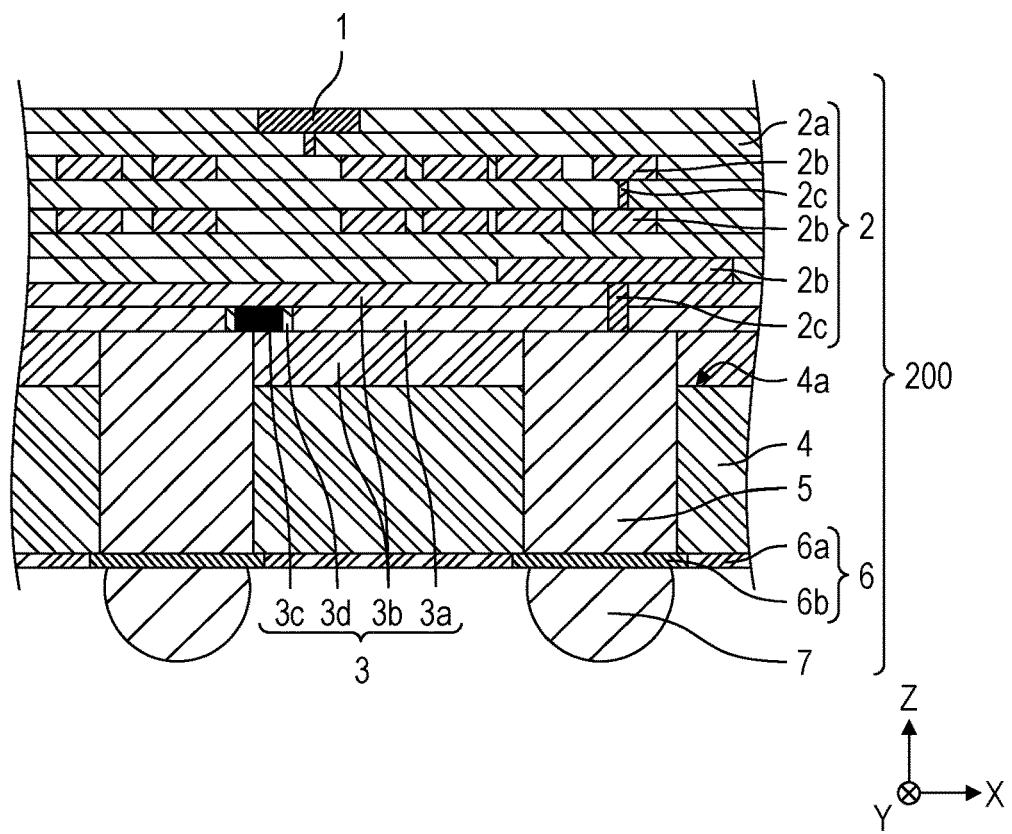
FIG. 2 is an enlarged cross-sectional view of a main part of semiconductor device 200 illustrated in FIG. 1.

A configuration example of semiconductor device 200 according to the first exemplary embodiment of the present disclosure will be described with reference to FIGS. 1 and 2. FIG. 1 is an overall cross-sectional view of semiconductor device 200 according to the first exemplary embodiment of the present disclosure, and FIG. 2 is an enlarged cross-sectional view of a main part of semiconductor device 200 illustrated in FIG. 1. FIG. 2 illustrates an enlarged view of a portion surrounded by a broken line indicated by reference numeral A in FIG. 1.

Semiconductor device 200 includes a plurality of bonded electrodes 1, multilayered internal wiring layer 2, strain sensor forming layer 3, base material 4, a plurality of through electrodes 5, rewiring layer 6, and a plurality of external coupling electrodes 7.

Bonded electrode 1, multilayered internal wiring layer 2, strain sensor forming layer 3, base material 4, rewiring layer 6, and external coupling electrode 7 are laminated in this order in the minus Z-axis direction.

The plurality of bonded electrodes 1 are provided on the upper side surface (the surface in the plus Z-axis direction) of multilayered internal wiring layer 2. The plurality of bonded electrodes 1 are arranged apart from each other in the X-axis direction.

Multilayered internal wiring layer 2 has a structure in which a plurality of insulating layers 2*a* are laminated in the up-down direction. In multilayered internal wiring layer 2, internal wiring 2*b*, which is provided between insulating layers 2*a* adjacent to each other, and a plurality of micro vias 2c, which couple internal wirings 2b provided between insulating layers 2a adjacent to each other, are formed.

Insulating layer 2a is an insulating member that insulates internal wirings 2b adjacent to each other in the up-down direction, insulates internal wirings 2b from bonded electrode 1, and further insulates around micro via 2c. The plurality of bonded electrodes 1 are formed on insulating layer 2a provided on the outermost side in the plus Z-axis direction of the plurality of insulating layers 2a.

Of the plurality of micro vias 2c, a part of micro vias 2c positioned at the lowermost side of multilayered internal wiring layer 2 is provided in semiconductor layer 3a. The lower end of micro via 2c is in contact with the upper surface of through electrode 5.

The shape of micro via 2c is not limited to the illustrated example. For example, micro via 2c may have a shape in which the lower end thereof extends so as to penetrate strain sensor forming layer 3 and a shape coupled to through electrode 5.

Insulating layer 2a is made of, for example, a silicon oxide film ($SiO_2$), a silicon nitride film (SiN), a silicon oxynitride film (SiON), or the like. Internal wiring 2b, micro via 2c, and bonded electrode 1 are formed by using, for example, copper (Cu), aluminum (Al), tungsten (W), gold (Au), or the like. Bonded electrode 1, internal wiring 2b, micro via 2c, and insulating layer 2a may each be formed of the same material or may be formed of different materials depending on the positions of the plurality of insulating layers 2a.

Strain sensor forming layer 3 includes semiconductor layer 3a, two insulating layers 3b, strain sensor 3c, and insulating film 3d. Strain sensor forming layer 3 is a layer that forms a strain sensor portion as a whole with these components.

Semiconductor layer 3a is made of germanium, single crystal silicon, polycrystalline silicon, amorphous silicon, silicon carbide, or the like.

Two insulating layers 3b may be formed of the same material as each other or may be formed of different materials. Of two insulating layers 3b, insulating layer 3b on the upper side of strain sensor 3c is an insulating member that insulates between insulating layer 2a constituting multilayered internal wiring layer 2 and strain sensor 3c. Of two insulating layers 3b, the insulating layer on the lower side of strain sensor 3c is an insulating member that insulates between insulating layer 101b, which will be described later, and strain sensor 3c. In addition to strain sensor 3c, a circuit other than strain sensor 3c, for example, a transistor may be formed on semiconductor layer 3a.

Strain sensor 3c is formed by diffusing impurities such as boron and phosphorus into a part of semiconductor layer 3a isolated by insulating film 3d. Strain sensor 3c is provided adjacent to through electrode 5, for example. The position of strain sensor 3c may be a position facing an upper end surface of through electrode 5 or a position facing the side surface of through electrode 5. The upper end surface of through electrode 5 is the end surface of through electrode 5 in the plus Z-axis direction. The side surface of through electrode 5 is an outer peripheral surface of through electrode 5 that is orthogonal to the XY plane. Details of strain sensor 3c and through electrode 5 will be described later.

Insulating film 3d is an insulating member that insulates between strain sensor 3c and semiconductor layer 3a. Insulating film 3d is made of, for example, a silicon oxide film ($SiO_2$), a silicon nitride film (SiN), a silicon oxynitride film (SiON), or the like.

Base material 4 is provided so as to face an end surface of insulating layer 3b in the minus Z-axis direction. Base material 4 is made of, for example, silicon (Si), glass, a polyimide film, a PET film, or the like. Strain sensor forming layer 3 is formed on main surface 4a (the front surface of base material 4) of base material 4.

The plurality of through electrodes 5 pass through the plurality of insulating layers 3b and base material 4 in the up-down direction and are arranged apart from each other in the X-axis direction. The upper end of through electrode 5 illustrated on the left side in FIG. 2 is coupled to strain sensor 3c. The upper end of through electrode 5 illustrated on the right side in FIG. 2 is coupled to micro via 2c and is electrically coupled to internal wiring 2b through micro via 2c.

Through electrode 5 may be electrically coupled to strain sensor 3c through micro via 2c, internal wiring 2b, or the like. In FIG. 2, through electrode 5 passes through the plurality of insulating layers 3b and base material 4 in the up-down direction, but through electrode 5 may be provided, for example, so as to pass through the plurality of insulating layers 3b, base material 4, semiconductor layer 3a, and insulating layer 2a.

Through electrode 5 includes, for example, a conductor formed of a metal in a tubular shape and an insulating film formed around the conductor. The insulating film has a function of preventing an electrical leakage that occurs between base material 4 and semiconductor layer 3a. For example, an organic substance such as a resin may be embedded in a part of the conductor, or a gap may be provided around the conductor to reduce the amount of the conductor used while maintaining insulation. As a result, the amount of the conductor used can be reduced, and the manufacturing cost of semiconductor device 200 can be reduced.

Rewiring 6b is coupled to through electrode 5. Rewiring 6b is a conductive electrode formed on a back surface of base material 4 (the surface opposite to the side of main surface 4a of base material 4) and is coupled to external coupling electrode 7. Through electrode 5 and rewiring 6b can be made of, for example, copper (Cu), tungsten (W), titanium (Ti), tantalum (Ta), titanium-tungsten alloy (TiW), polysilicon, or the like. Rewiring 6b is insulated by insulating layer 6a.

External coupling electrode 7 is, for example, a solder ball, a resin ball having a conductive film formed on the front surface thereof, a bump formed by wire bonding, or the like. When external coupling electrode 7 is a solder ball, a solder material having various compositions such as Sn—Ag—Cu type and Sn—Ag—Bi type can be used for external coupling electrode 7. When external coupling electrode 7 is a bump formed by wire bonding, gold (Au), copper (Cu), or the like can be used for external coupling electrode 7.

Through electrode 5 and external coupling electrode 7 include electrodes for two purposes. One is an electrode that is electrically coupled to bonded electrode 1 through micro via 2c, and the other is an electrode that is electrically coupled to strain sensor 3c. The former is an electrode for normal product operation, and the latter is an electrode for strain measurement by a strain sensor 3c. In this way, by using two types of electrodes having different uses, strain sensor 3c can be made independent from the circuit (product circuit) that functions as a normal product.

By making the function of strain sensor 3c independent of the function of the product circuit in this way, it is possible to prevent the measurement of strain sensor 3c from affecting the characteristics of the product. Further, it is possible to prevent noise generated in the product circuit from entering the measured value of strain sensor 3c. The product circuit is, for example, a circuit mounted on an automobile, a home appliance, an FA apparatus, or the like.

Strain sensor 3c is coupled to external coupling electrode 7 via through electrode 5 and rewiring 6b (including internal wiring 2b and micro via 2c in some cases), and further electrically coupled to an external apparatus (not illustrated) through a wiring that is coupled to the external coupling electrode 7.

With such a coupling, the electrical wiring length to the external apparatus can be shortened as compared with a general wiring method, that is, a method of coupling the wiring to main surface 4a of base material 4. By shortening the electrical wiring length in this way, noise is less likely to be superimposed on the measured value of strain sensor 3c transmitted to the wiring path, and the accuracy of strain measurement is improved.

It is not necessary to provide the internal wiring on the main surface 4a of base material 4 for acquiring the measured value of strain sensor 3c, and further, an extra space for providing a measurement pad coupled to the internal wiring becomes unnecessary. Therefore, semiconductor device 200 can be miniaturized.

Of the members constituting semiconductor device 200, through electrode 5 has a relatively high linear expansion coefficient and occupies a relatively large volume. Therefore, regarding the thermal expansion and contraction of through electrode 5, the thermal expansion and contraction of through electrode 5 is the largest among the members constituting semiconductor device 200. The linear expansion coefficient represents the rate at which the length, volume, or the like of an object expands as the temperature rises. By providing strain sensor 3c adjacent to through electrode 5, the strain generated in semiconductor device 200 due to the change in heat can be accurately measured, and the estimation accuracy of the market defect (the defect discovered in the market) can be improved. Details will be described later.

Configuration of Strain Sensor 3c

Strain sensor 3c is a semiconductor gauge formed by diffusing impurities such as boron and phosphorus in semiconductor layer 3a. Strain sensor 3c has a structure having a very thin thickness, for example, the size (thickness) of strain sensor 3c in the vertical direction is 10 to 500 [nm], and the size of strain sensor 3c in the surface direction (horizontal direction) is 10 to 900 [nm]. The vertical direction is equal to the laminating direction in which the first board and the second board are laminated. The first board may be constituted by multilayered internal wiring layers 2 and 108, strain sensor forming layers 3 and 109, and base material 4 of the present exemplary embodiment. The second board may be constituted by bonded board 201 of the present exemplary embodiment.

When strain sensor 3c is distorted by applying an external stress to strain sensor 3c to which a constant current is supplied, the voltage value detected by strain sensor 3c changes. The strain is calculated based on the resistance change rate and the gauge rate by using the amount of change in the voltage value. That is, the strain calculation utilizes the piezo resistance effect in which the electrical resistance changes when a mechanical strain is applied to the gauge.

Figure 3:
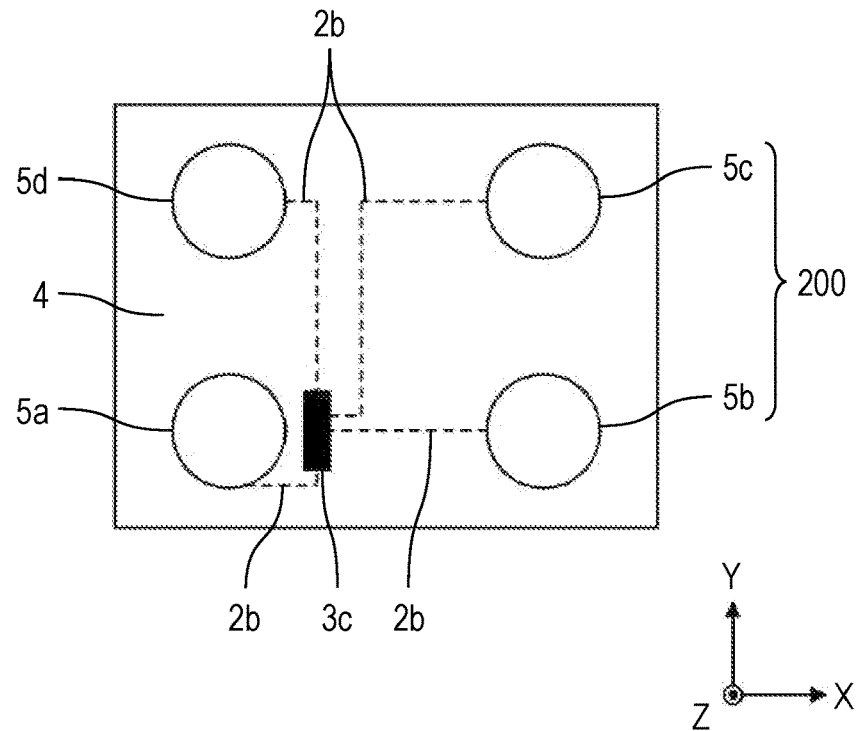
FIG. 3 is a schematic view illustrating a disposition example of strain sensor 3c, four through electrodes 5a, 5b, 5c, and 5d, and internal wiring 2b.

A method of the specific current supply and a method of the potential measurement will be described with reference to FIG. 3. FIG. 3 is a schematic view illustrating a disposition example of strain sensor 3c, four through electrodes 5a, 5b, 5c, and 5d, and internal wiring 2b.

Each of four through electrodes 5a, 5b, 5c, and 5d corresponds to four through electrodes 5 disposed so as to surround strain sensor 3c among the plurality of through electrodes 5 illustrated in FIGS. 1 and 2. Since these through electrodes 5a, 5b, 5c, and 5d are coupled to external coupling electrode 7, a current supplied from the outside of external coupling electrode 7 can flow in each process, and the voltage generated in strain sensor 3c is applied.

With strain sensor 3c, the strain can be measured by, for example, the four-terminal method. The four-terminal method is a method for measuring a potential difference of the voltage generated between the remaining two electrodes BC, for example, by making a constant current to flow between the two electrodes AD among the four electrodes A, B, C, and D, to obtain the resistance. Specifically, the current is made to flow indirectly from two through electrodes 5a and 5d to strain sensor 3c through micro via 2c and internal wiring 2b (in some cases, working directly without passing these), and at this time, by detecting the potential difference generated between two through electrodes 5b and 5c, the strain measurement using strain sensor 3c is performed.

For the strain generated by strain sensor 3c, a two-terminal method can be used in addition to the four-terminal method. The two-terminal method is, for example, a method in which two electrode terminals are provided at both ends of strain sensor 3c, and the current flowing through strain sensor 3c and the potential difference generated at that time are measured by using the two electrode terminals. Compared with the four-terminal method, the two-terminal method has an advantage that the device is simpler to manufacture and the potential difference can be easily measured.

However, it is known that the two-terminal method is more susceptible to the wiring resistance of the wiring (not illustrated) (metal cables or the like laid outside semiconductor device 200) or contact resistance or the like that are coupled to external coupling electrode 7 as compared with the four-terminal method. Therefore, variations are likely to occur in the measured value of the strain. By using the four-terminal method, the strain can be measured accurately without being affected by the wiring resistance of the wiring and contact resistance or the like. Therefore, it is preferable to use the four-terminal method for strain sensor 3c.

Strain sensor 3c is not limited to the semiconductor type (semiconductor gauge) described above and may be a metal type. Metal type strain sensor 3c is generally made of a Cu—Ni based alloy or an Ni—Cr based alloy and may be made of a platinum metal or nickel in order to increase the sensitivity.

However, since the measurement sensitivity of semiconductor type strain sensor 3c is several tens of times superior compare to the measurement sensitivity of the metal type strain sensor 3c, by adopting semiconductor type strain sensor 3c, the minute strain can be measured.

Semiconductor type strain sensor 3c can be classified into a p-type semiconductor (diffusing boron or the like), an n-type semiconductor (diffusing phosphorus or the like), and the like according to the type of impurities to be diffused. Strain sensor 3c of the p-type semiconductor can measure the strain in the horizontal direction (X-axis or Y-axis direction). Strain sensor 3c of the n-type semiconductor can measure the strain in the vertical direction. By using strain sensor 3c of the n-type semiconductor, the strain in the vertical direction inside semiconductor device 200 due to the thermal expansion and contraction of through electrode 5 can be measured.

By using single crystal silicon instead of germanium, polycrystalline silicon, amorphous silicon, silicon carbide, or the like for semiconductor layer 3a that forms strain sensor 3c, the strain measurement sensitivity can be further enhanced. As a result, it is possible to suppress an increase in the material cost required for forming semiconductor layer 3a.

Figure 4:
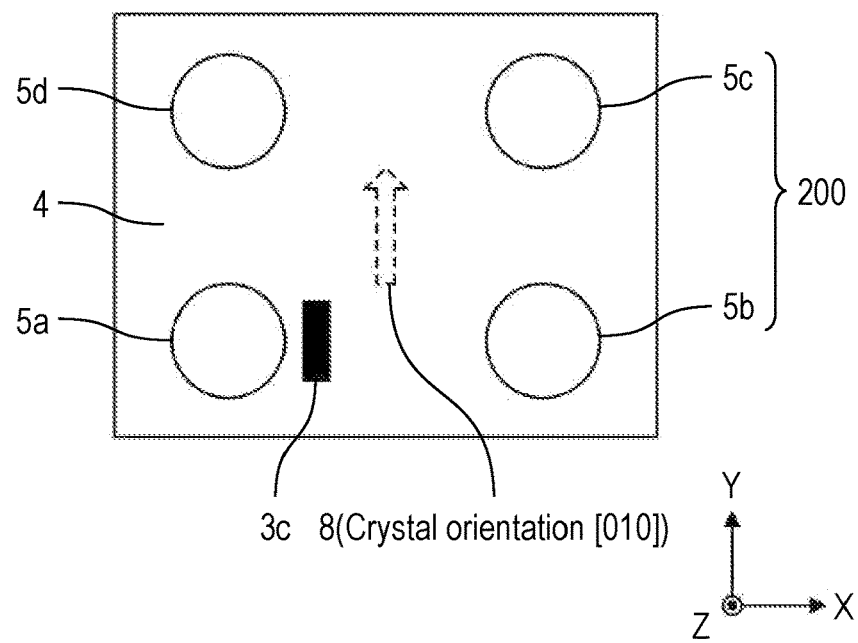
FIG. 4 is a diagram for explaining a positional relationship between strain sensor 3c and through electrode 5.
Figure 5:
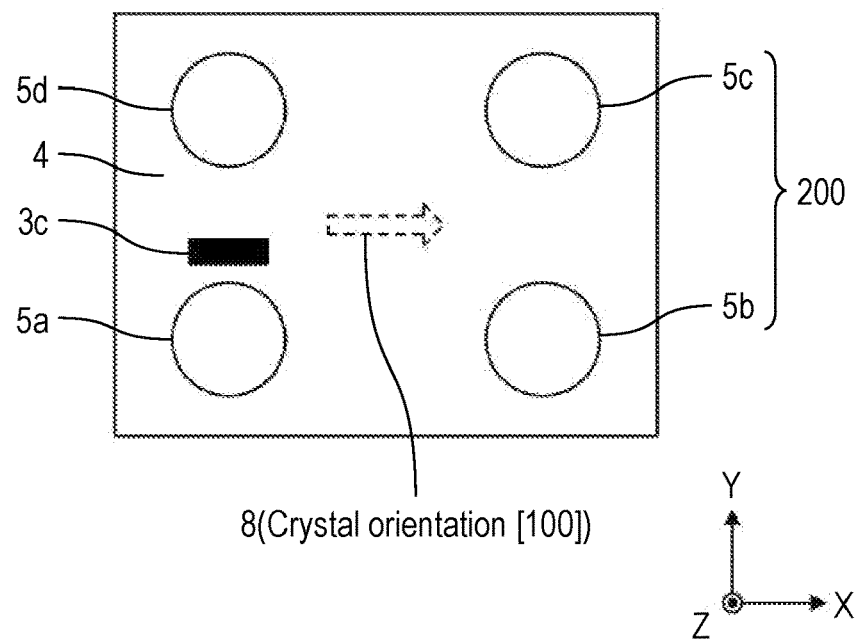
FIG. 5 is a diagram for explaining a positional relationship between strain sensor 3c and through electrode 5.
Figure 6:
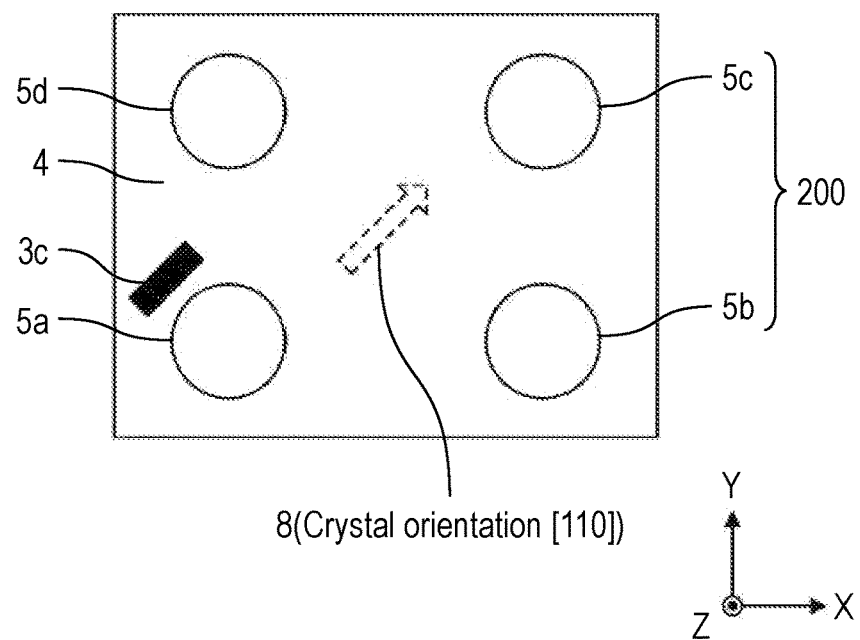
FIG. 6 is a diagram for explaining a positional relationship between strain sensor 3c and through electrode 5.

Next, with reference to FIGS. 4 to 6, a positional relationship between strain sensor 3c and through electrode 5, the shape of strain sensor 3c in the horizontal direction, a relationship between strain sensor 3c and crystal orientation 8 of semiconductor layer 3a, and the like are discussed. FIGS. 4 to 6 are diagrams for explaining a positional relationship between strain sensor 3c and through electrode 5.

The shape of strain sensor 3c in a plan view in the vertical direction is, for example, a rectangle. In rectangular strain sensor 3c, for example, a current is supplied to two short side portions of strain sensor 3c, and the potential difference of the voltage generated in the two short side portions is measured.

As illustrated in FIG. 4, rectangular strain sensor 3c is formed on semiconductor layer 3a so as to extend along crystal orientation 8 [010] of semiconductor layer 3a that forms strain sensor 3c, for example. That is, strain sensor 3c is disposed such that the longitudinal side portion of strain sensor 3c is parallel to the crystal orientation of semiconductor layer 3a.

Strain sensor 3c is disposed between two through electrodes 5 provided on base material 4 in the minus Y-axis direction among four through electrodes 5 and is disposed near through electrode 5 in the minus X-axis direction among these two through electrodes 5.

By disposing strain sensor 3c in this way, for example, a current is supplied to strain sensor 3c of the n-type semiconductor in parallel with crystal orientation 8, and by measuring the potential difference detected at this time, the affection of the strain in the horizontal direction is minimized, and the strain in the vertical direction can be measured more sensitively.

As described above, strain sensor 3c is formed such that the longitudinal side portion faces one through electrode 5 of four through electrodes 5 so that strain at the portion where the strain due to the thermal expansion and contraction of through electrode 5 is generated can be measured more sensitively.

When the short side portion becomes long, the contact area of strain sensor 3c increases to a portion where the strain is not generated (for example, the central portion of the region surrounded by four through electrodes 5 in base material 4). As a result, even when through electrode 5 expands and contracts, the amount of strain per unit area of strain sensor 3c becomes relatively small, and the rate of change in the resistance value also becomes small so that the measurement sensitivity of strain decreases. Therefore, when the shape of strain sensor 3c is set to be rectangular, it is preferable to configure strain sensor 3c such that the length of the short side portion is as short as possible.

The shape of strain sensor 3c in a plan view is not limited to a rectangle. The shape may be other than a rectangle as long as the shape is such that the above-mentioned four-terminal method can be applied, that is, the shape is such that a current can be supplied to strain sensor 3c and the potential difference of the voltage generated by strain sensor 3c can be measured. Examples of shapes other than a rectangle include a square, an ellipse, a ring shape (doughnut shape), and a C shape in which a part of the ring shape is missing. However, in semiconductor type strain sensor 3c, a desired strain characteristic can be obtained by supplying a current in a direction parallel to crystal orientation 8 of the semiconductor layer forming strain sensor 3c. Therefore, for example, when semiconductor type strain sensor 3c having the above-described donut shape, a C shape, or the like is used, a current cannot be supplied in a direction parallel to crystal orientation 8, and it is difficult to measure the desired amount of strain. Therefore, the shape of semiconductor type strain sensor 3c is preferably rectangular.

Strain sensor 3c may be disposed as illustrated in FIGS. 5 and 6. Strain sensor 3c illustrated in FIG. 5 is disposed in semiconductor device 200 so as to extend along crystal orientation 8 [100]. Strain sensor 3c illustrated in FIG. 6 is disposed in semiconductor device 200 so as to extend along crystal orientation 8 [110].

Example of Method for Manufacturing Semiconductor Device 200

Next, a method for manufacturing semiconductor device 200 according to the first exemplary embodiment will be described with reference to FIGS. 7 to 11. FIGS. 7 to 11 are diagrams for explaining a method for manufacturing semiconductor device 200 according to the first exemplary embodiment of the present disclosure. FIGS. 7 to 11 illustrate an enlarged view of a portion surrounded by a broken line indicated by reference numeral A in FIG. 1.

Figure 7:
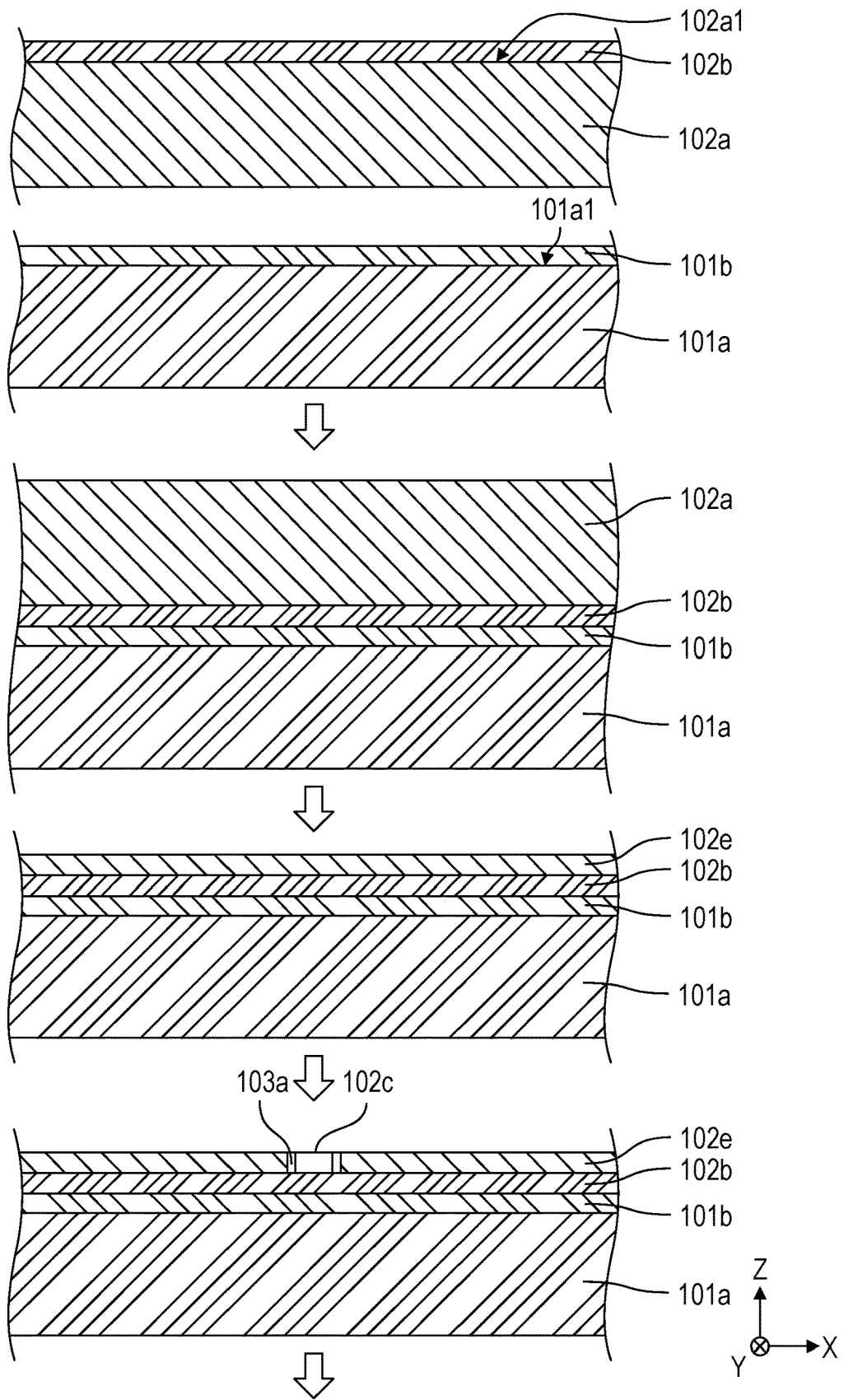
FIG. 7 is a diagram for explaining a method for manufacturing semiconductor device 200 according to the first exemplary embodiment of the present disclosure.

As illustrated in the first diagram from the top in FIG. 7, insulating layer 101b is formed on main surface 101a1 of base material 101a, and insulating layer 102b is further formed on main surface 102a1 of semiconductor board 102a. Insulating layer 101b and insulating layer 102b may be formed on both base material 101a and semiconductor board 102a or may be formed on either one of them. Examples of the method for forming insulating layer 101b and insulating layer 102b include thermal oxidation, chemical vapor deposition (CVD) method and sputtering method in the case of a silicon oxide film ($SiO_2$).

As illustrated in the second diagram from the top in FIG. 7, the surface to which base material 101a and semiconductor board 102a are bonded is hydrophilized with a hydrogen peroxide mixed solution or the like, and then insulating layer 102b of semiconductor board 102a is bonded to insulating layer 101b of base material 101a. The bonding method includes a heat treatment method and a front surface activation method. In the front surface activation method, the surface to be bonded is activated by sputtering with an ion beam of argon in a vacuum and insulating layer 102b of semiconductor board 102a is bonded to insulating layer 101b of base material 101a in a vacuum.

As illustrated in the third diagram from the top in FIG. 7, semiconductor layer 102e is formed by polishing and thinning the back surface (the surface of semiconductor board 102a opposite to insulating layer 102b side) of semiconductor board 102a by using a method such as a chemical mechanical polishing (CMP).

As illustrated in the fourth diagram from the top in FIG. 7, by etching semiconductor layer 102e with the resist pattern as a mask and digging trench (shallow groove) 103a, element 102c that becomes strain sensor 3c is made independent on semiconductor layer 102e. Thereafter, the resist pattern is washed and removed.

Figure 8:
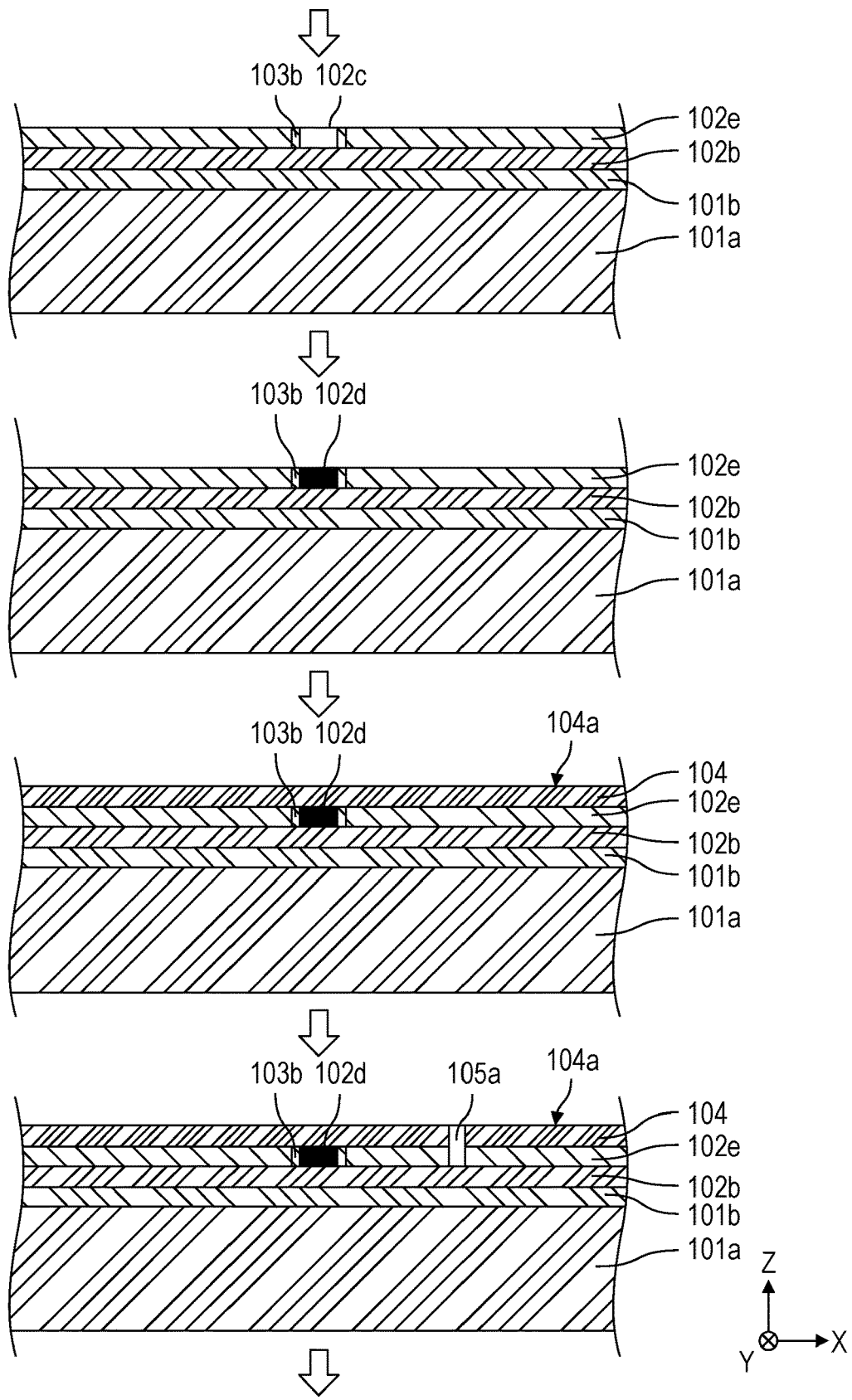
FIG. 8 is a diagram for explaining a method for manufacturing semiconductor device 200 according to the first exemplary embodiment of the present disclosure.

As illustrated in the first diagram from the top in FIG. 8, an insulating layer is formed on the back surface (the surface of semiconductor layer 102e opposite to insulating layer 102b side) of semiconductor layer 102e by embedding an insulating material in trench 103a by using a CVD method or the like.

Thereafter, by removing the insulating layer formed on the back surface (the surface of semiconductor layer 102e opposite to insulating layer 102b side) of semiconductor layer 102e by using the CMP or the like, the insulating material remains in trench 103a. The insulating material forms insulating film 103b embedded in trench 103a. Element 102c is insulated from semiconductor layer 102e, in which element 102c is formed around in the horizontal direction, by insulating film 103b.

As illustrated in the second diagram from the top in FIG. 8, strain sensor 102d is formed by diffusing the impurities such as boron and phosphorus into element 102c using the resist pattern as a mask. A transistor (the product circuit described above) that functions as a product may be formed on semiconductor layer 102e that forms strain sensor 102d. The transistor is an example of a circuit other than the strain sensor formed on semiconductor layer 102e.

By forming the transistor on semiconductor layer 102e, strain sensor 102d and the transistor can be provided on one semiconductor layer 102e so that it is not necessary to provide a semiconductor layer separate from semiconductor layer 102e for the formation of the transition. Therefore, the number of semiconductor layers 102e can be reduced, and an additional bonding process is not required so that the material cost and assembling processes of semiconductor device 200 can be reduced.

As illustrated in the third diagram from the top in FIG. 8, insulating film 104 is formed on the back surface (the surface of semiconductor layer 102e opposite to insulating layer 102b side) of semiconductor layer 102e by using the CVD method or the like. As a result, strain sensor forming layer 109 is completed.

As illustrated in the fourth diagram from the top in FIG. 8, a micro via resist pattern is formed, and an etching process is performed using the micro via resist pattern as a mask to form micro via pattern 105a on insulating film 104. Thereafter, the micro via resist pattern is washed and removed.

Figure 9:
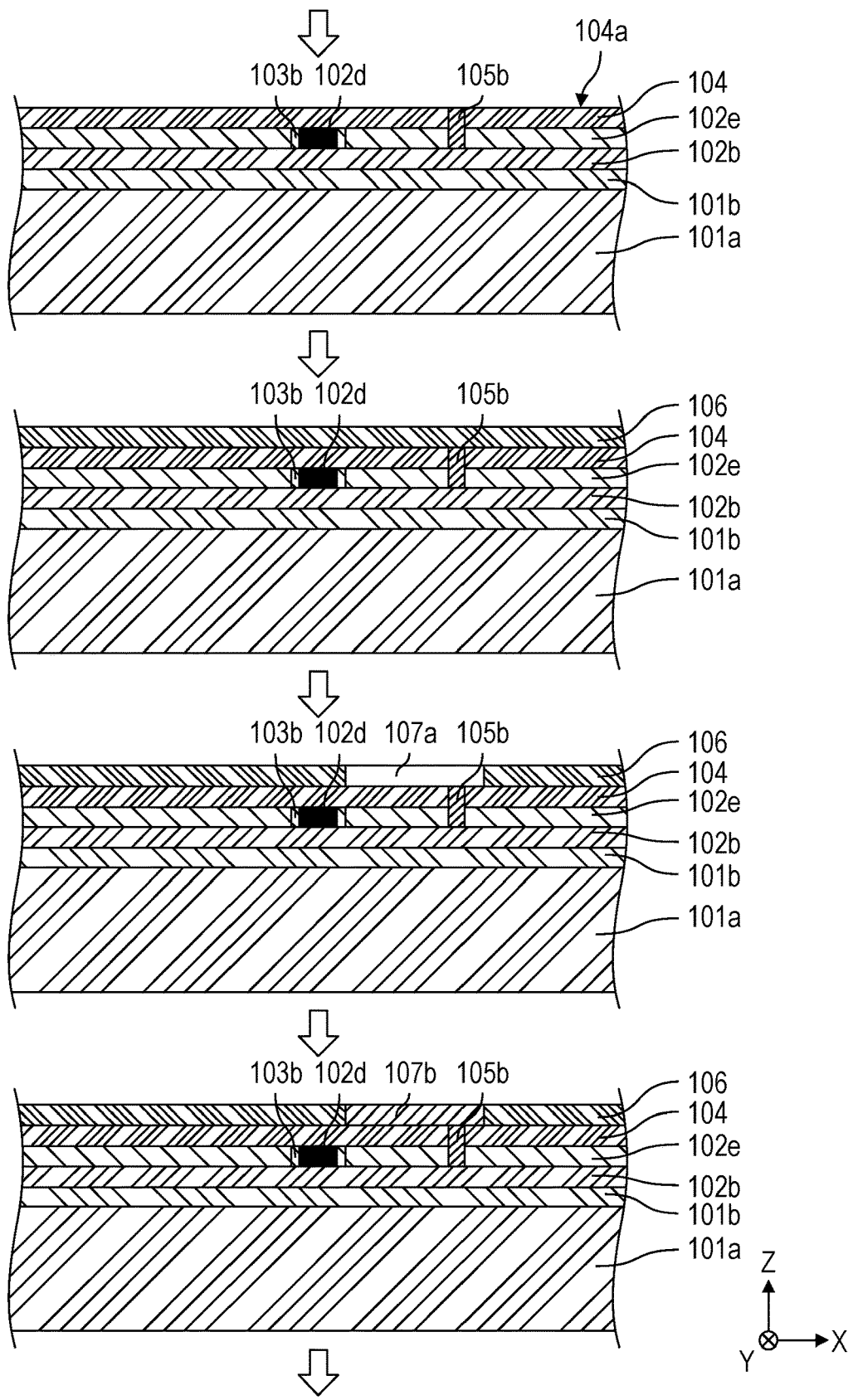
FIG. 9 is a diagram for explaining a method for manufacturing semiconductor device 200 according to the first exemplary embodiment of the present disclosure.

As illustrated in the first diagram from the top in FIG. 9, a layer made of a micro via material is formed by embedding micro via pattern 105a on main surface 104a (the surface of insulating film 104 opposite to semiconductor layer 102e side) of insulating film 104 by using the CVD method or the like.

Thereafter, by removing the layer using the CMP or the like, the micro via material remains in micro via pattern 105a. This material forms micro via 105b embedded in micro via pattern 105a.

As illustrated in the second diagram from the top in FIG. 9, insulating layer 106 is formed on main surface 104a of insulating film 104 by using the CVD method or the like.

As illustrated in the third diagram from the top in FIG. 9, internal wiring pattern 107a is formed on insulating layer 106 by forming an internal wiring resist pattern (not illustrated) and performing an etching process using the internal wiring resist pattern as a mask. Thereafter, the internal wiring resist pattern is removed by cleaning.

As illustrated in the fourth diagram from the top in FIG. 9, a layer made of an internal wiring material is formed by embedding internal wiring pattern 107a on the front surface (the surface of insulating layer 106 opposite to insulating film 104 side) of insulating layer 106 by using the CVD method or the like.

Thereafter, by removing the layer using the CMP or the like, the internal wiring material remains in internal wiring pattern 107a. This material forms internal wiring 107b embedded in internal wiring pattern 107a.

Figure 10:
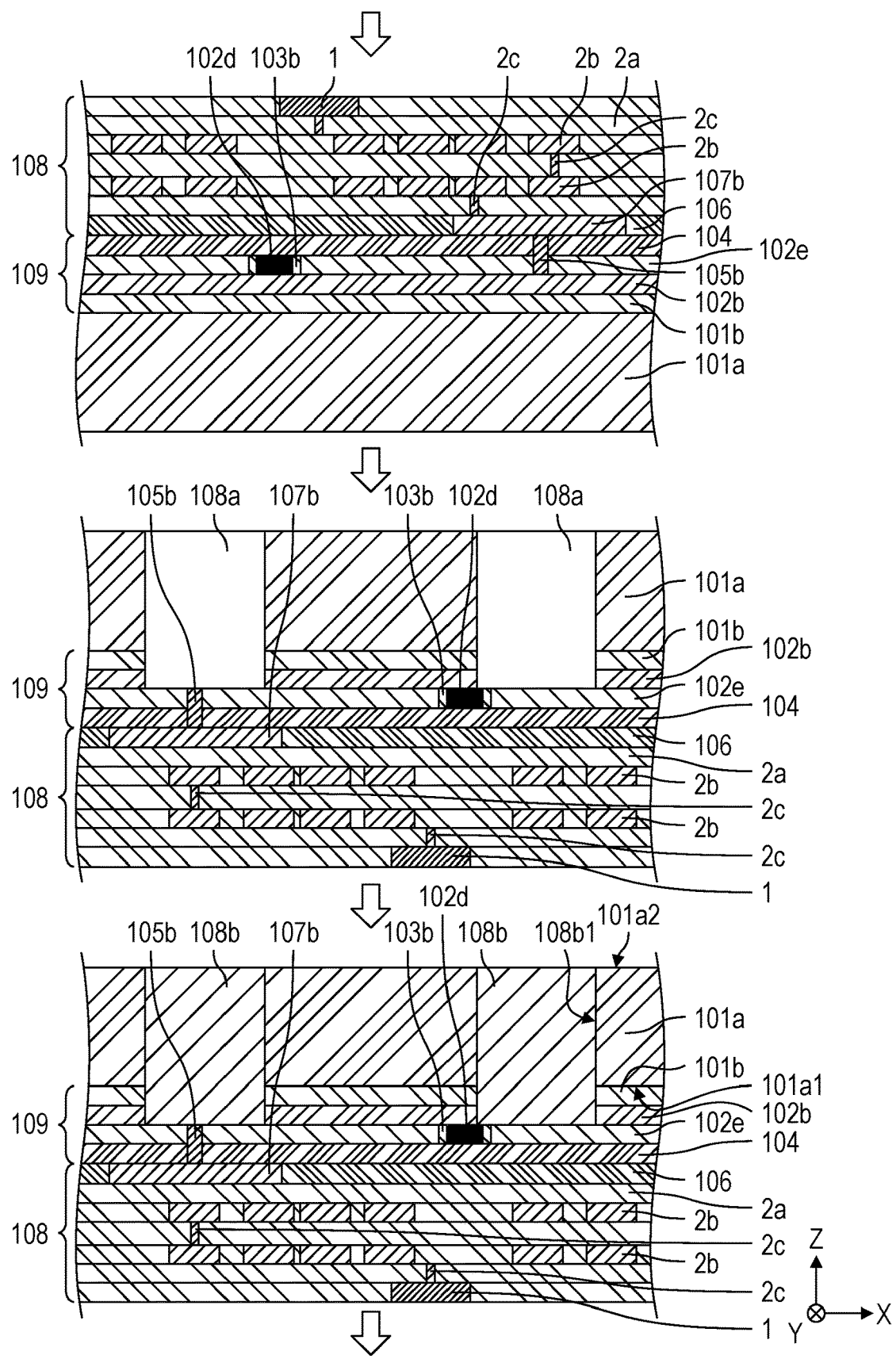
FIG. 10 is a diagram for explaining a method for manufacturing semiconductor device 200 according to the first exemplary embodiment of the present disclosure.

Thereafter, by repeating from the process illustrated in the fourth diagram from the top in FIG. 8 to the process illustrated in the fourth diagram from the top in FIG. 9, as illustrated in the first diagram from the top in FIG. 10, multilayered internal wiring layer 108 is formed on the upper side of strain sensor forming layer 109. A plurality of internal wirings 107b are formed in multilayered internal wiring layer 108. The number of repetitions of this process (internal wiring process) is generally substantially 10 times but may be any one from 1 to 20 times as needed.

As illustrated in the second diagram from the top in FIG. 10, a plurality of through holes 108a are formed at predetermined positions of base material 101a by using a Bosch process or the like that repeats the side wall cover with polymer and anisotropic plasma etching. Through hole 108a is formed so as to pass through not only base material 101a but also layers such as insulating layer 101b and insulating layer 102b made of a plurality of different materials. Thereafter, the polymer used for the side wall cover is then removed by cleaning.

When through electrode 108b and internal wiring 107b are electrically coupled, through hole 108a is further formed so as to pass through semiconductor layer 102e, insulating film 104, and insulating layer 106.

In the Bosch process, by changing the type of gas used in anisotropic plasma etching to those that can selectively etch the material of the layer to be etched, through holes 108a can be formed in a plurality of layers in which each material is different.

As illustrated in the third diagram from the top in FIG. 10, a layer of the through electrode material is formed on the back surface (surface 101a2 of base material 101a opposite to main surface 101a1) of base material 101a by embedding the through electrode material in through hole 108a by using the CVD method or the like.

Thereafter, by removing the layer formed on the back surface of base material 101a with the CMP or the like, the through electrode material remains in through hole 108a. The material of the through electrode forms through electrode 108b embedded in through hole 108a.

Before through electrode 108b is formed, an insulating film may be formed on the wall surface (inner peripheral surface) that forms through hole 108a by using the CVD method or the like. As a result, it is possible to prevent electrical leakage from through electrode 108b to base material 101a.

Through electrode 108b does not need to be formed so as to completely embed through holes 108a. For example, through electrode 108b may be provided by forming a through electrode material in a film-shaped on the bottom portion of through hole 108a and the side surface around the bottom portion. In this case, an insulating resin or the like may be embedded in the portion of the internal space of through hole 108a where the through electrode material is not provided. As a result, the amount of material used for through electrode 108b can be reduced.

Figure 11:
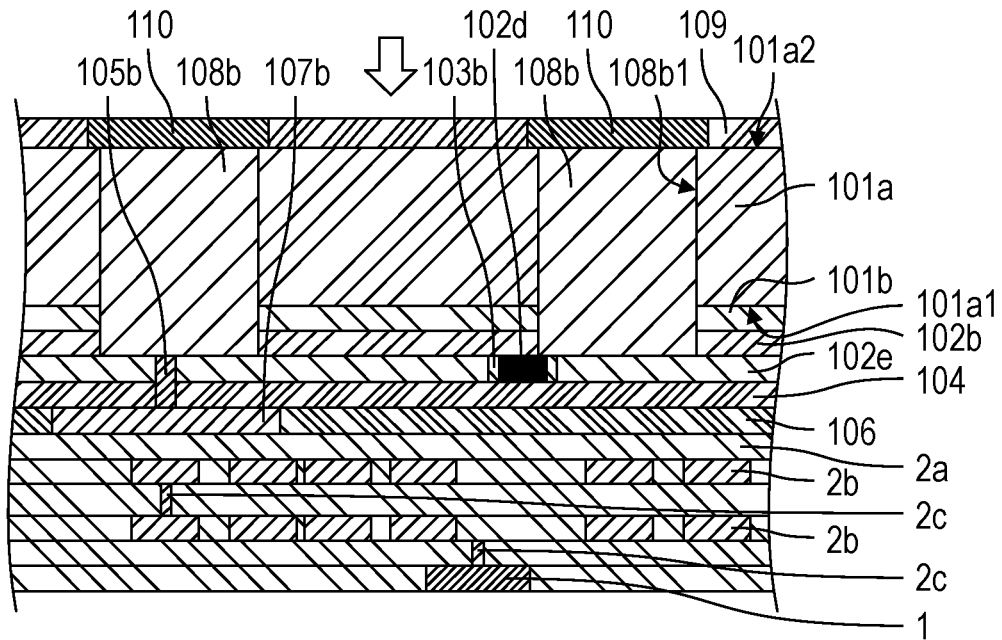
FIG. 11 is a diagram for explaining a method for manufacturing semiconductor device 200 according to the first exemplary embodiment of the present disclosure.
Figure 11:
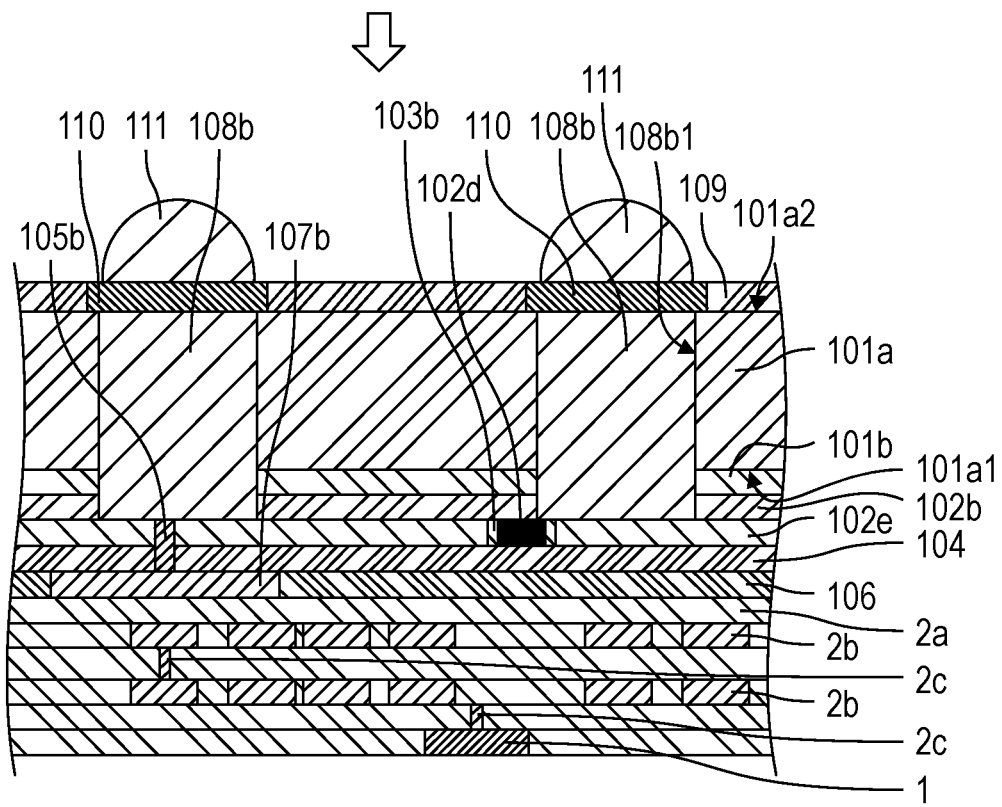

As illustrated in the first diagram from the top in FIG. 11, rewiring 110 is formed on the back surface of (the surface of through electrode 108b opposite to semiconductor layer 102e side) through electrode 108b. Rewiring 110 is a conductive member that electrically couples through electrode 108b and external coupling electrode 111 described later. Rewiring 110 is formed by using an electrolytic plating method, an electroless plating method, or the like.

An insulating layer is formed on surface 101a2 of base material 101a opposite to main surface 101a1 side such that a predetermined position where external coupling electrode 111 is formed is opened. The insulating layer is formed by a spin coating method, a slit coating method, or the like.

As illustrated in the second diagram from the top in FIG. 11, external coupling electrode 111 is formed on a portion of the front surface of rewiring 110 that is not covered with the insulating layer. The material of external coupling electrode 111 is a solder ball, a conductive resin ball, a stud bump, or the like.

When a solder ball or a conductive resin ball is used, the coupling of external coupling electrode 111 to rewiring 110 may be either soldering or bonding with a conductive adhesive. Instead of using the solder balls, conductive resin balls, or the like, external coupling electrode 111 may be formed by supplying the solder paste onto the rewiring 131 and reflowing the solder paste by using a screen printing method.

When using stud bumps such as gold (Au) and copper (Cu), external coupling electrode 111 is formed by using a fine wire such as gold (Au) or copper (Cu) (for example, φ10 to 50 [μm]), a wire bonding device, or the like.

Strain Measurement Operation and Action by Strain Sensor 3c

Figure 12:
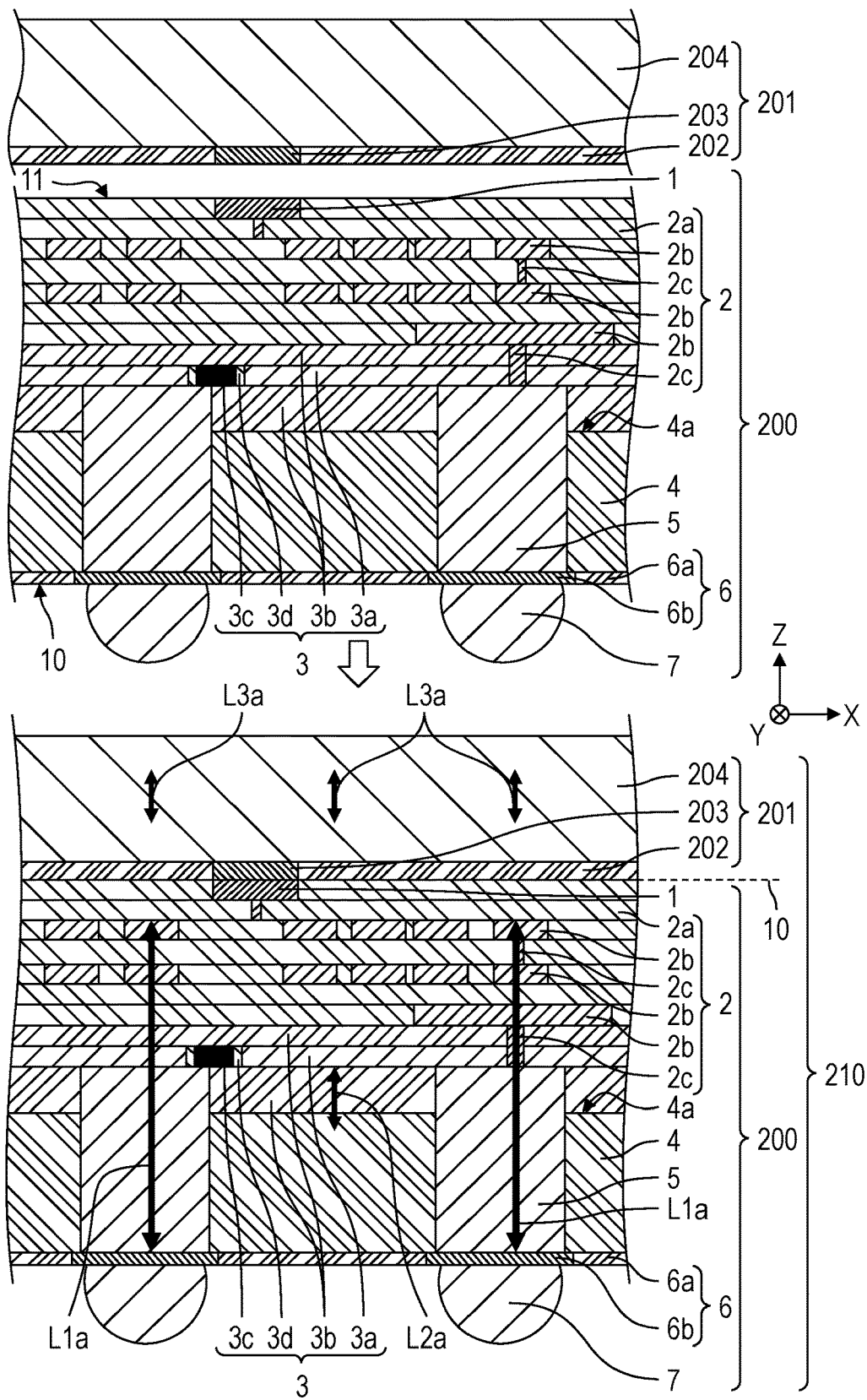
FIG. 12 is a diagram for explaining a mechanism in which peeling off occurs on a bonded surface between semiconductor device 200 and bonded board 201 according to the first exemplary embodiment of the present disclosure.
Figure 13:
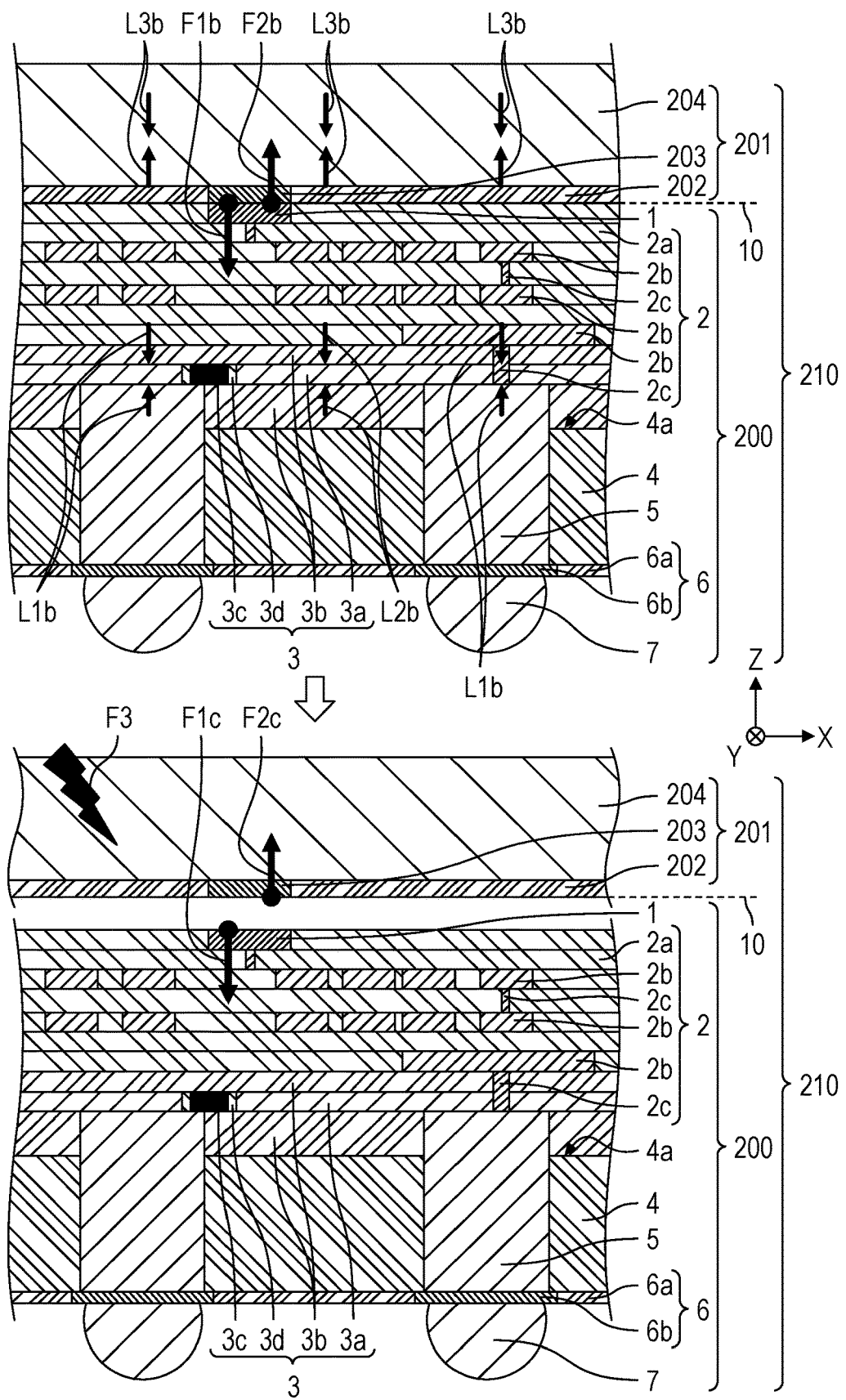
FIG. 13 is a diagram for explaining a mechanism in which the peeling off occurs on a bonded surface between semiconductor device 200 and bonded board 201 according to the first exemplary embodiment of the present disclosure.

Next, the strain measurement operation by strain sensor 3c will be described with reference to FIGS. 12 and 13. FIGS. 12 and 13 are diagrams for explaining a mechanism in which the peeling off occurs on a bonded surface between semiconductor device 200 and bonded board 201 according to the first exemplary embodiment of the present disclosure.

As illustrated in the first diagram from the top in FIG. 12, bonded board 201 to be bonded to semiconductor device 200 facing semiconductor device 200 is prepared. Bonded board 201 includes a silicon board 204, copper (Cu) electrode 203 provided on a surface of silicon board 204 on semiconductor device 200 side, and a silicon oxide film ($SiO_2$) 202 provided on the surface.

The configuration example of bonded board 201 may be any board on which semiconductor device 200 can be bonded and is not limited to the illustrated example.

Among the plurality of members constituting semiconductor device 200 and bonded board 201 bonded in this way, the member having a particularly large amount of internal strain due to thermal expansion and contraction is through electrode 5 having a large thickness and a large linear expansion coefficient. The thickness of each of base material 4 and through electrode 5 is several tens [μm] to several hundreds [μm], which is very large, while the thickness of each of multilayered internal wiring layer 2 and strain sensor forming layer 3 is several [μm] or less.

When base material 4 is made of silicon having high rigidity, the linear expansion coefficient of silicon is, for example, $3.9 \times 10^{-6}$, and base material 4 is unlikely to have strain. In the contrast to this, through electrode 5 is a metal conductor, and when the conductor is, for example, copper (Cu), the linear expansion coefficient of copper (Cu) is $14.3 \times 10^{-6}$, and through electrode 5 is likely to have strain.

As illustrated in the second diagram from the top in FIG. 12, bonded electrode 1 and copper (Cu) electrode 203 face each other, and insulating layer 2a and silicon oxide film ($SiO_2$) 202 face each other so as to make them contact with each other. Bonded electrode 1 and copper (Cu) electrode 203 are metal bonded and insulating layer 2a and silicon oxide film ($SiO_2$) 202 are covalently joined.

At this time, for metal bonding between bonded electrode 1 and copper (Cu) electrode 203, it is necessary to apply load and high temperature. The high temperature is, for example, a high temperature of 350 to 500° C. When the activation process is not performed on the bonded surface, the temperature required for metal bonding is 700 to 900° C.

Since the high temperature is applied to the metal bond in this way, the internal strain is generated inside semiconductor device 200 and bonded board 201 due to the thermal expansion of each of the constituent members. Specifically, through electrode 5 having a large internal strain generates internal strain L1a in the expansion direction due to heating. Internal strain L2a in the expansion direction due to heating is generated in base material 4 having a small internal strain. Internal strain L1a in the expansion direction due to heating is generated in bonded board 201.

Since copper (Cu) electrode 203 and bonded electrode 1 are bonded to the boundary between copper (Cu) electrode 203 and bonded electrode 1 in a state where the internal strain is generated, no stress is generated during the metal bonding. The details of this stress will be described later.

The bonding time by heating is generally substantially 15 to 60 minutes, and each constituent member is sufficiently thermally expanded during this bonding time. Laminated semiconductor device 210 is formed by bonding.

After the metal bonding by loading and heating is completed, laminated semiconductor device 210 is cooled until it reaches room temperature. At this time, as illustrated in the first diagram from the top in FIG. 13, thermal contraction due to cooling occurs inside laminated semiconductor device 210. Specifically, internal strain L3b in the contraction direction due to cooling is generated on bonded board 201. Internal strain L2b in the contraction direction due to cooling is generated in base material 4. Since the thermal expansions of base material 4 and bonded board 201 are small, internal strain L3b and internal strain L2b have small values.

Internal strain L1b in the contraction direction due to cooling is generated in through electrode 5. Internal strain L1b has a smaller value as compared with internal strain L1a in the expansion direction due to heating. This is because, despite the large thermal expansion of through electrode 5, the position of insulating layer 2a with respect to the up-down direction is fixed by the bonding between semiconductor device 200 and bonded board 201, thereby through electrode 5 positioned on the lower side of insulating layer 2a cannot sufficiently contract.

As described above, when through electrode 5 cannot sufficiently contract, due to the contraction force remaining on through electrode 5, downward stress F1b that tries to peel off the bonded surface between semiconductor device 200 and bonded board 201 is generated in semiconductor device 200.

On the other hand, upward stress F2b is generated on the bonded board 201 which has a reaction force of silicon board 204 having high rigidity.

When the magnitude of stress F1b and stress F2b that try to peel off the bonded surface is less than the force between the metal bonding and the covalent joining of the bonded surface since the peeling off on the bonded surface does not occur in the bonding process, semiconductor device 200 and bonded board 201 maintain continuity. Therefore, the electrical inspection of the inspection process is skipped, and the market shipment is performed. Thereafter, it is shipped to the market through processes such as secondary mounting for the customer.

In the market, for example, due to vibration to a device provided with laminated semiconductor device 210, dropping of a device provided with laminated semiconductor device 210, or the like, as illustrated in the second diagram from the top in FIG. 13, mechanical stress F3 is generated in laminated semiconductor device 210. At this time, since mechanical stress F3 is combined with stress F1b and stress F2b generated in the bonding process on the bonded surface of laminated semiconductor device 210, stress F1c and stress F2c are generated by combining stress F1b and stress F2b with mechanical stress F3.

When stress F1b and stress F2b generated in the bonding process become larger than at the time of design due to variations in the bonding process conditions, variations in the material properties, or the like, stress F1c and stress F2c exceed the force of the metal bonding and the covalent joining. As a result, the peeling off occurs on the bonded surface, the continuity between semiconductor device 200 and bonded board 201 is lost, and market defect occurs.

The following measures can be taken to suppress the occurrence of such market defects. Such measures include, for example, inspecting stress F1b and stress F2b generated on the bonded surface in the bonding process, those that are presumed to be market defects as a result of inspection and are not shipped as in-process defects, and feeding back to the bonding process conditions while monitoring within the bonding process. Reducing stress F1b and stress F2b within the standard by such measures is effective in suppressing the occurrence of market defects.

It can be seen that the internal strain of through electrode 5 greatly affects the stress generated on the bonded surface by the mechanism of peeling off occurrence described above. Therefore, by providing strain sensor 3c adjacent to through electrode 5 having a large internal strain, the internal strain of through electrode 5 can be measured. Thereby, data such as the measured value of strain sensor 3c (the amount of internal strain of through electrode 5) and the stress for peeling off the bonded surface (downward stress F1b and upward stress F2b) can be obtained. By obtaining these data from defective products on the market and linking the data in advance with a database, it is possible to realize in-process inspection of the internal stress and monitoring.

Strain sensor 3c is a semiconductor gauge formed by diffusing impurities such as boron and phosphorus in semiconductor layer 3a. When a constant current is supplied to strain sensor 3c, since the detected voltage changes due to strain sensor 3c itself being distorted due to the application of external stress, the strain can be calculated based on the amount of change in voltage, the rate of change in resistance, and the gauge rate. That is, the strain calculation utilizes the piezo resistance effect in which the electrical resistance changes when a mechanical strain is applied to the gauge.

Effect of Strain Sensor 3c

Figures 14, 15:
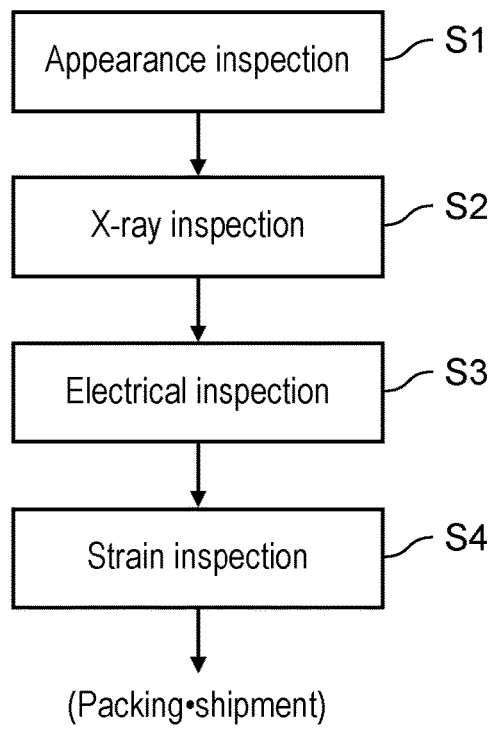
FIG. 14 is a diagram illustrating an inspection flow of semiconductor device 200 according to the first exemplary embodiment of the present disclosure.
FIG. 15 is a diagram illustrating an example of associating measured values (amount of strain) of strain sensor 3c of the present disclosure with market defects (stress generated on a bonded surface)

FIG. 14 is a diagram illustrating an inspection flow of semiconductor device 200 according to the first exemplary embodiment of the present disclosure. FIG. 15 is a diagram illustrating an example of associating measured values (amount of strain) of strain sensor 3c of the present disclosure with market defects (stress generated on a bonded surface).

As illustrated in FIG. 14, in the inspection process of semiconductor device 200, the strain inspection process in step S4 is added to the appearance inspection in step S, the X-ray inspection in step S2, and the electrical inspection in step S3 in the related art.

In the strain inspection process, by measuring the residual stress generated inside laminated semiconductor device 210 by using an external apparatus, as illustrated in FIG. 15, it is possible to detect a product in which a subsequent continuity failure or the like may occur.

In addition to the mechanical stresses in the market described above, even when the peeling off occurs on the bonded surface of laminated semiconductor device 210 due to the combination of thermal stress and mechanical stress in the secondary mounting process for the customer, by performing the same strain inspection process, it is possible to detect a subsequent continuity failure in advance.

The following are exemplified as the subsequent defective modes due to the combination of the internal strain of through electrode 5 and a plurality of stresses (thermal stress, mechanical stress, or the like) generated in the customer process and the market. For example, insulation between internal wiring 2b and micro via 2c cannot be performed due to the occurrence of a crack in insulating layer 2a in multilayered internal wiring layer 2, or continuity failures such as loss of electrical coupling due to occurrence of continuity failure that causes electrical leakage and cracks in internal wiring 2b and micro via 2c, or the like. By performing the same strain inspection process for these defective modes, it is possible to detect a subsequent continuity failure in advance.

Second Exemplary Embodiment

Figure 16:
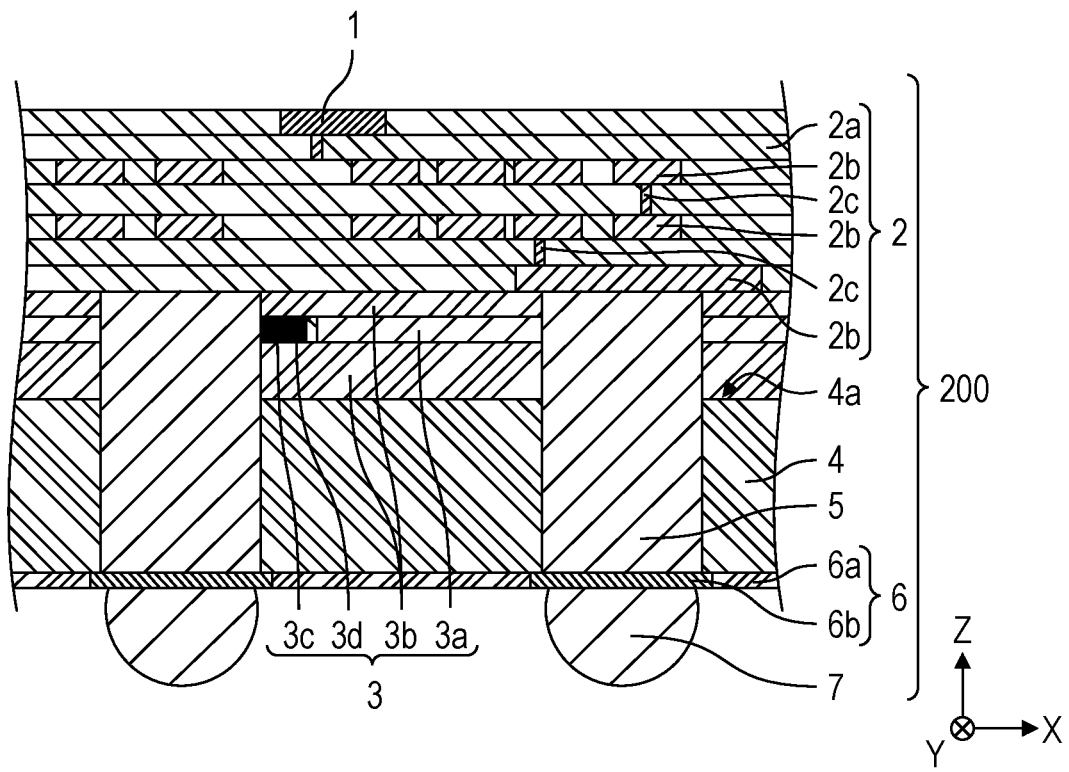
FIG. 16 is an enlarged cross-sectional view of a main part of semiconductor device 200 according to a second exemplary embodiment of the present disclosure.

Next, a configuration example of semiconductor device 200 according to a second exemplary embodiment of the present disclosure will be described with reference to FIG. 16. FIG. 16 is an enlarged cross-sectional view of a main part of semiconductor device 200 according to the second exemplary embodiment of the present disclosure. An enlarged position is the same as the portion surrounded by the broken line indicated by the reference numeral A in FIG. 1. In the following, the same parts as those in the first exemplary embodiment are designated by the same reference numerals, the description thereof will be omitted, and different parts will be described.

In order to improve the measurement accuracy of the internal strain of semiconductor device 200, it is preferable to provide strain sensor 3c in a portion where the strain is large. Semiconductor device 200 according to the second exemplary embodiment includes strain sensor 3c provided adjacent to the side surface of through electrode 5 which is a portion having a large strain. It is preferable that strain sensor 3c is electrically coupled to through electrode 5 in a direct manner.

With this configuration, since strain sensor 3c is coupled to through electrode 5 without touching insulating film 3d, the strain of through electrode 5 can be directly measured without being affected by the strain of the constituent members other than through electrode 5. As a result, the strain inside semiconductor device 200 can be measured with higher accuracy.

Third Exemplary Embodiment

Figure 17:
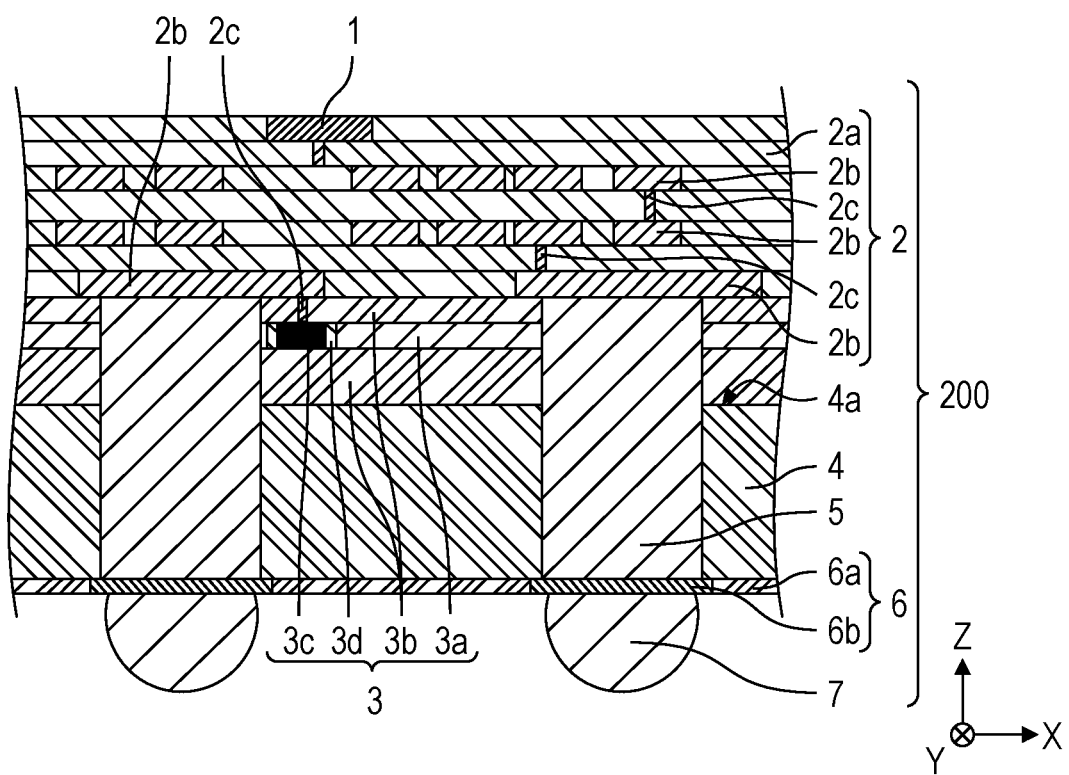
FIG. 17 is an enlarged cross-sectional view of a main part of semiconductor device 200 according to a third exemplary embodiment of the present disclosure.

Next, a configuration example of semiconductor device 200 according to a third exemplary embodiment of the present disclosure will be described with reference to FIG. 17. FIG. 17 is an enlarged cross-sectional view of a main part of semiconductor device 200 according to the third exemplary embodiment of the present disclosure. An enlarged position is the same as the portion surrounded by the broken line indicated by the reference numeral A in FIG. 1. In the following, the same parts as those in the second exemplary embodiment are designated by the same reference numerals, the description thereof will be omitted, and different parts will be described.

In semiconductor device 200 according to the third exemplary embodiment, strain sensor 3c is electrically coupled to through electrode 5 through micro vias 2c and internal wiring 2b. Micro via 2c and internal wiring 2b are arranged in the vertical direction and are coupled to each other.

Micro via 2c and internal wiring 2b for electrically coupling strain sensor 3c to through electrode 5 are provided on the upper side of strain sensor 3c. Internal wiring 2b is provided on the upper side of through electrode 5. With this configuration, when the strain is generated in through electrode 5 in the vertical direction due to the thermal expansion, micro via 2c and internal wiring 2b are distorted together with through electrodes 5 in the vertical direction, and by transmitting this strain to strain sensor 3c, the strain of through electrode 5 can be measured by strain sensor 3c.

In semiconductor device 200 according to the third exemplary embodiment, since strain sensor 3c is not electrically coupled to through electrode 5 in a direct manner, even when the strain is generated in through electrode 5 in the vertical direction due to the thermal expansion, the contact area of strain sensor 3c with internal wiring 2b is difficult to change, and the contact area of internal wiring 2b with through electrode 5 is also difficult to change. Therefore, even when through electrode 5 is thermally expanded in the vertical direction, the contact area between strain sensor 3c and through electrode 5 does not change, and since the contact area does not change, the contact resistance between strain sensor 3c and through electrode 5 does not change either. As a result, it is possible to prevent an increase in the error of the measured value of strain sensor 3c due to the change in the contact resistance.

Strain sensor 3c and through electrode 5 may be disposed adjacent to each other through insulating film 3d and a part of semiconductor layer 3a. However, in order to measure the strain of through electrode 5 more accurately, it is preferable to shorten the distance between strain sensor 3c and through electrode 5. Therefore, it is preferable that strain sensor 3c is disposed so as to be adjacent to through electrode 5 via only insulating film 3d without including a part of semiconductor layer 3a.

Fourth Exemplary Embodiment

Figure 18:
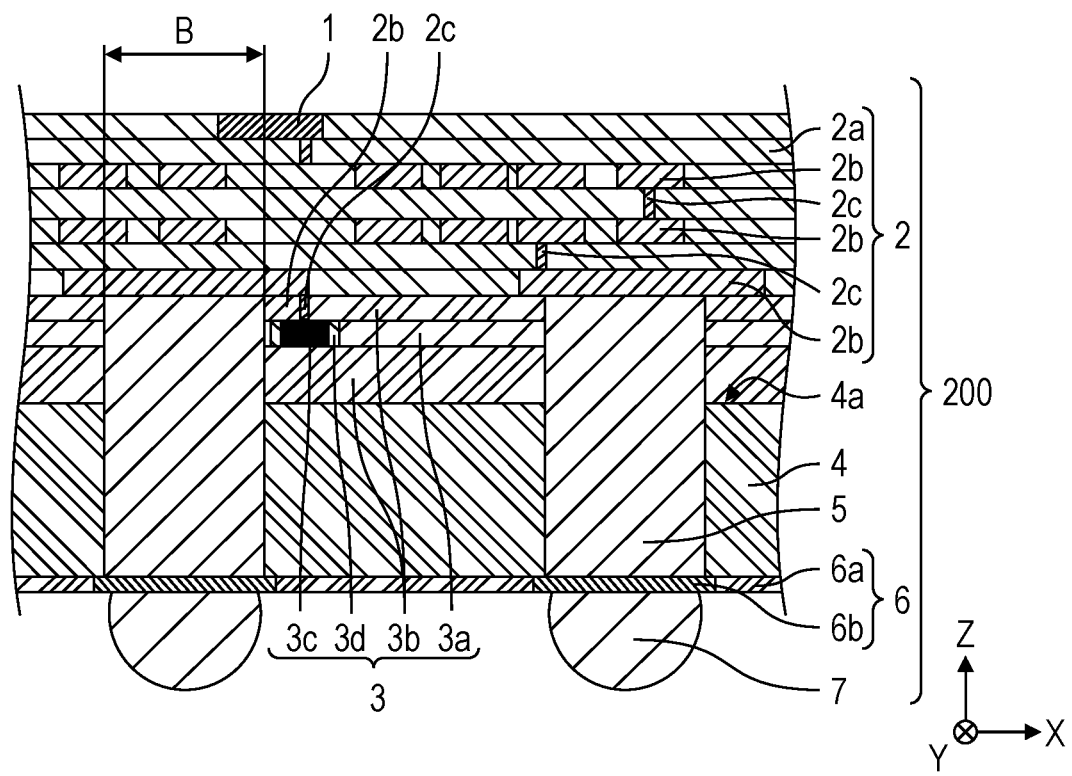
FIG. 18 is an enlarged cross-sectional view of a main part of semiconductor device 200 according to a fourth exemplary embodiment of the present disclosure.

Next, a configuration example of semiconductor device 200 according to a fourth exemplary embodiment of the present disclosure will be described with reference to FIG. 18. FIG. 18 is an enlarged cross-sectional view of a main part of semiconductor device 200 according to the fourth exemplary embodiment of the present disclosure. An enlarged position is the same as the portion surrounded by the broken line indicated by the reference numeral A in FIG. 1. In the following, the same parts as those in the third exemplary embodiment are designated by the same reference numerals, the description thereof will be omitted, and different parts will be described.

When peeling off occurs between copper (Cu) electrode 203 and bonded electrode 1 on the bonded surface between bonded board 201 and semiconductor device 200 illustrated in FIG. 12 and the like described above, a market defect (continuity failure) may occur. In order to estimate such market defects, for example, among the plurality of bonded electrodes 1 illustrated in FIG. 1, it is preferable to measure the strain of through electrode 5 corresponding to bonded electrode 1, which is likely to be peeled off from copper (Cu) electrode 203.

From this point of view, strain sensor 3c of semiconductor device 200 according to the fourth exemplary embodiment is disposed adjacent to through electrode 5 corresponding to bonded electrode 1, which is likely to be peeled off from copper (Cu) electrode 203.

For example, as illustrated in FIG. 18, when virtual region B extending in the vertical direction of through electrode 5 includes at least a part of the bonded electrode 1, bonded electrode 1 is considered to be an electrode disposed at a position where peeling off is likely to occur due to the thermal expansion and contraction of through electrode 5. As described above, by providing strain sensor 3c near through electrode 5 corresponding to bonded electrode 1, which is particularly likely to be peeled off among the plurality of bonded electrodes 1, market defects can be easily estimated.

When at least a part of each of the plurality of bonded electrodes 1 is disposed in virtual region B extending in the vertical direction of through electrode 5, since the peeling off that occurs on the bonded surface corresponding to the plurality of bonded electrodes 1 can be estimated, market defects can be estimated more easily.

As described above, semiconductor device 200 of the present disclosure includes: a first board that has a first end surface and a second end surface opposite to the first end surface; a plurality of first electrodes that are provided on the first end surface; a second electrode that is provided on the second end surface and electrically coupled to an electrode of a second board that is attached to the second end surface; an internal wiring that is provided inside the first board and electrically coupled to the second electrode; a plurality of third electrodes that are provided inside the first board and electrically couple the first electrode and the internal wiring to each other; and a strain sensor that is provided inside the first board and measures a strain generated in the first board, in which a linear expansion coefficient of the third electrode is larger than a linear expansion coefficient of the first board. The first board may be constituted by multilayered internal wiring layers 2 and 108, strain sensor forming layers 3 and 109, and base material 4 of the present exemplary embodiment. The second board may be constituted by bonded board 201 of the present exemplary embodiment. The third electrode may be constituted by through electrode 5 of the present exemplary embodiment.

With this configuration, it is possible to measure the strain generated in the device during processing and the residual strain remaining in the device after the processing. Therefore, a prediction group of products that cannot be detected by an electrical inspection or an X-ray inspection in a pre-shipment inspection but is expected to become defective in a later process, can be detected before the shipment.

Even in semiconductor device 200, which is further increasing in density and miniaturization, it is possible to detect late-coming defects in advance that occur in the secondary mounting process or the market, which are difficult to detect by the electrical inspection or the X-ray inspection.

A method for manufacturing semiconductor device 200 of the present disclosure includes: forming insulating layer 101b on base material 101a; forming strain sensor 102d on insulating layer 101b; forming insulating layer 106 so as to cover strain sensor 102d; forming internal wiring 107b on insulating layer 106; forming multilayered internal wiring layer 108 so as to cover internal wiring 107b; forming through hole 108a on a side opposite to multilayered internal wiring layer 108 of base material 101a; forming through electrode 108b in through hole 108a so as to be adjacent to strain sensor 102d; coupling external coupling electrode 111 that transmits a voltage detected by strain sensor 102d to an external apparatus to through electrode 108*b*; and bonding bonded board 201 so as to cover internal wiring 107*b*.

One aspect of the present disclosure is suitable for a semiconductor device and a method for manufacturing the semiconductor device.

What is claimed is:

1. A semiconductor device comprising:
    a first board that has a first end surface and a second end surface opposite to the first end surface;
    a second board that is attached to the second end surface of the first board;
    a plurality of first electrodes that are provided on the first end surface;
    a second electrode that is provided on the second end surface and electrically coupled to an electrode of the second board;
    an internal wiring that is provided inside the first board and electrically coupled to the second electrode;
    a plurality of third electrodes that are provided inside the first board and electrically couple the first electrodes to the internal wiring; and
    a strain sensor that is provided inside the first board and measures a strain generated in the first board,
    wherein a linear expansion coefficient of each of the third electrodes is larger than a linear expansion coefficient of the first board,
    the first board includes a plurality of layers that are laminated,
    the linear expansion coefficient of each of the third electrodes is larger than a linear expansion coefficient of the internal wiring,
    the strain sensor is provided inside a strain sensor forming layer, the strain sensor forming layer including two insulating layers and a semiconductor layer that forms the strain sensor, the semiconductor layer being provided between the two insulating layers, and
    the plurality of third electrodes pass through one of the two insulating layers.

2. The semiconductor device of claim 1,
    wherein the strain sensor is provided between the plurality of third electrodes arranged apart from each other in a direction orthogonal to a laminating direction in which the first board and the second board are laminated.

3. The semiconductor device of claim 2,
    wherein the strain sensor is adjacent to and electrically coupled to one of the plurality of third electrodes in a direct manner.

4. The semiconductor device of claim 2,
    wherein the strain sensor is adjacent to and electrically coupled to one of the plurality of third electrodes through internal wirings and micro vias arranged in the laminating direction.

5. The semiconductor device of claim 1,
    wherein the second electrode overlaps with the third electrode in a laminating direction in which the first board and the second board are laminated, and
    the strain sensor is provided adjacent to the third electrode.

6. The semiconductor device of claim 5,
    wherein the plurality of second electrodes overlap with the third electrode in the laminating direction.

7. The semiconductor device of claim 1,
    wherein the semiconductor layer that forms the strain sensor is made of single crystal silicon.

8. The semiconductor device of claim 1,
    wherein the strain sensor is formed of an n-type semiconductor.

9. The semiconductor device of claim 1,
    wherein the strain sensor has a shape extending along a crystal orientation of the semiconductor layer that forms the strain sensor.

10. The semiconductor device of claim 9,
    wherein the shape of the strain sensor in a plan view in a laminating direction in which the first board and the second board are laminated is rectangular.

11. The semiconductor device of claim 10,
    wherein the strain sensor that is rectangular is disposed such that a longitudinal side portion of the strain sensor is parallel to the crystal orientation.

12. The semiconductor device of claim 1,
    wherein a circuit other than the strain sensor is formed on the semiconductor layer on which the strain sensor is formed.

13. The semiconductor device of claim 1,
    wherein the first board has holes, in which the third electrodes are disposed, and an insulating film formed on an inner peripheral surface of each of the holes.

14. The semiconductor device of claim 1,
    wherein each of the third electrodes includes a film-shaped electrode material formed at a bottom portion of a hole in which the third electrode is disposed.

15. The semiconductor device of claim 1,
    wherein the plurality of third electrodes include an electrode to which the strain sensor is coupled and an electrode to which a circuit other than the strain sensor is coupled.

16. The semiconductor device of claim 1,
    wherein the plurality of third electrodes are provided inside the plurality of layers of the first board.

17. The semiconductor device of claim 1,
    wherein the plurality of third electrodes pass through the strain sensor forming layer.

* * * * *